(12) United States Patent
Kawato et al.

(10) Patent No.: US 10,090,467 B2
(45) Date of Patent: Oct. 2, 2018

(54) DEPOSITION MASK, DEPOSITION DEVICE, DEPOSITION METHOD, AND DEPOSITION MASK MANUFACTURING METHOD

(71) Applicant: SHARP KABUSHIKI KAISHA, Sakai (JP)

(72) Inventors: Shinichi Kawato, Sakai (JP); Manabu Niboshi, Sakai (JP); Yuhki Kobayashi, Sakai (JP); Kazuo Takizawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/519,058

(22) PCT Filed: Oct. 15, 2015

(86) PCT No.: PCT/JP2015/079232
§ 371 (c)(1),
(2) Date: Apr. 13, 2017

(87) PCT Pub. No.: WO2016/060216
PCT Pub. Date: Apr. 21, 2016

(65) Prior Publication Data
US 2017/0244035 A1    Aug. 24, 2017

(30) Foreign Application Priority Data

Oct. 15, 2014   (JP) .................. 2014-211102

(51) Int. Cl.
*H01L 51/00* (2006.01)
*C23C 14/04* (2006.01)
(Continued)

(52) U.S. Cl.
CPC .......... *H01L 51/0011* (2013.01); *C23C 14/02* (2013.01); *C23C 14/04* (2013.01);
(Continued)

(58) Field of Classification Search
CPC ............. H01L 2924/00; H01L 51/0011; H01L 2924/0002; H01L 51/56; H01L 51/5012
See application file for complete search history.

(56) References Cited

U.S. PATENT DOCUMENTS

2014/0377903 A1    12/2014 Takeda et al.
2016/0168691 A1*    6/2016 Takeda ................ H01L 27/3211
                                                     118/504

FOREIGN PATENT DOCUMENTS

| JP | 2013-227679 | 11/2013 |
| JP | 2015-17307 | 1/2015 |
| JP | 2015-92016 | 5/2015 |

OTHER PUBLICATIONS

International Search Report dated Dec. 8, 2015, directed to International Application No. PCT/JP2015/079232, 2 pages.

* cited by examiner

*Primary Examiner* — Tony Tran
(74) *Attorney, Agent, or Firm* — Morrison & Foerster LLP

(57) ABSTRACT

A magnetic material section is provided on a mask substrate so as to be interposed between Y aperture lines of the mask substrate and between X aperture line of the mask substrate. A portion of the magnetic material section which portion is interposed between the X aperture lines has a first thickness and a second thickness which is less than the first thickness, the first thickness being that of each sub-portion thereof which is positioned between mutually adjacent ones of the Y aperture lines, the second thickness being that of each sub-portion thereof which is positioned between apertures which are mutually adjacent in a Y direction.

11 Claims, 13 Drawing Sheets

(51) Int. Cl.
  *H01L 51/50* (2006.01)
  *H05B 33/10* (2006.01)
  *C23C 14/02* (2006.01)
  *H01L 51/56* (2006.01)
(52) U.S. Cl.
  CPC ............ *C23C 14/042* (2013.01); *H01L 51/50* (2013.01); *H01L 51/5012* (2013.01); *H01L 51/56* (2013.01); *H05B 33/10* (2013.01)

DEPOSITION MASK, DEPOSITION DEVICE, DEPOSITION METHOD, AND DEPOSITION MASK MANUFACTURING METHOD

CROSS-REFERENCE TO RELATED APPLICATIONS

This application is a U.S. National Phase patent application of International Patent Application No. PCT/JP2015/079232, filed Oct. 15, 2015, which claims priority to Japanese Application No. 2014-211102, filed Oct. 15, 2014, each of which is hereby incorporated by reference in the present disclosure in its entirety.

FIELD OF THE INVENTION

The present invention relates to a vapor deposition mask, a vapor deposition device, a vapor deposition method, and a method of producing a vapor deposition mask.

BACKGROUND OF THE INVENTION

Recent years have witnessed practical use of a flat-panel display in various products and fields. This has led to a demand for a flat-panel display that is larger in size, achieves higher image quality, and consumes less power.

Under such circumstances, great attention has been drawn to an EL display device that (i) includes an EL element which uses electroluminescence (hereinafter abbreviated to "EL") of an organic or inorganic material and that (ii) is an all-solid-state flat-panel display which is excellent in, for example, low-voltage driving, high-speed response, and light-emitting characteristics.

In order to achieve a full-color display, an EL display device includes a luminescent layer which outputs light of a desired color in correspondence with a plurality of sub-pixels constituting a pixel.

A luminescent layer is formed as a vapor-deposited film on a film formation target substrate (this substrate hereinafter also referred to simply as a "target substrate"). Specifically, in a vapor deposition process, a fine metal mask (FMM) having high-precision apertures is used as a vapor deposition mask, and differing vapor deposition particles are vapor deposited to each region of the target substrate.

In order to achieve a high-resolution EL display device, it is necessary to deposit the vapor deposition particles onto the target substrate with a high level of precision.

FIG. 12 and FIG. 13 are each a cross-sectional view of a target substrate and a vapor deposition mask, each figure being for explaining problems occurring with a conventional vapor deposition method. Note that in FIG. 12 and FIG. 13, dotted-line arrows represent paths of vapor deposition particles.

Conventionally, vapor deposition is generally carried out while the target substrate and the vapor deposition mask are caused to be in close contact. In a case (i) where a target substrate 305 and a vapor deposition mask 301 become separated, as illustrated in FIG. 12, and (ii) a vapor deposition particle enters and passes through an aperture 303 from an angle, with respect to the surface of the vapor deposition mask 301, which angle is smaller than a given angle, the vapor deposition particle is deposited in a region outside a sub-pixel region P. As a result, a vapor deposition region V becomes larger than the sub-pixel region P, and a luminescent layer 310 is formed in a manner so as to expand wider than the sub-pixel region P.

Furthermore, in a case where (i) vapor deposition particles are emitted from a vapor deposition source 307 which is not positioned opposite to an aperture 303, as illustrated in FIG. 13, and (ii) a vapor deposition particle enters and passes through the aperture 303 from an angle, with respect to the surface of the vapor deposition mask 301, which angle is smaller than a certain angle, the vapor deposition particle is deposited at a position out of alignment with the sub-pixel region P. As a result, the luminescent layer 310 is formed out of alignment with the sub-pixel region P.

In this way, performing vapor deposition while the target substrate 305 and the vapor deposition mask 301 are separated from each other causes a marked reduction in the precision of the vapor deposition pattern. As such, in order to avoid a reduction in the precision of the vapor deposition pattern, it is necessary to carry out vapor deposition while the target substrate 305 and the vapor deposition mask 301 are in a state of close contact.

In a conventional vapor deposition process, a vapor deposition mask is attached evenly to a frame via strong tension, and, in a vapor deposition device, the vapor deposition mask is caused to come into close contact with a substrate via a mechanical means.

With merely a mechanical means, however, factors such as a lack of device precision and the introduction of a foreign object make it impossible to ensure an adequate degree of contact between the target substrate and the vapor deposition mask. Note that, conventionally, a vapor deposition mask is generally made from a metal material.

In recent years, in order to address this issue, a method to ensure close contact between a mask and a target substrate has become commonly employed, specifically a method in which a magnetic force generating source, such as a magnet or electromagnet, is provided on a substrate holder side of a vapor deposition device, and the vapor deposition mask is magnetically attracted toward the substrate holder side.

At the same time, in recent years, vapor deposition masks have been proposed in which a mask substrate (mask base material) thereof is made by using non-metallic materials, such as resin or ceramic materials. Using such materials in the mask substrate makes it possible to form high-precision apertures in the mask substrate by use of, for example, laser processing. As such, using a vapor deposition mask made from such materials makes it possible to increase the precision of the vapor deposition pattern. However, since such materials are not magnetic, they do not allow a vapor deposition mask and a target substrate to be brought into close contact via magnetic force.

In attempting to address this, Patent Literature 1 discloses a vapor deposition mask including (i) a metallic mask having a plurality of rows of slits and (ii) a resin mask laminated to the metallic mask, which resin mask has apertures provided at positions coinciding with the slits.

According to Patent Literature 1, the vapor deposition mask including the metallic mask and the resin mask makes it possible to carry out deposition through high-precision apertures formed in the resin mask while also causing the target substrate and the vapor deposition mask to be in close contact via magnetic force.

CITATION LIST

Japanese Patent Application Publication Tokukai No. 2013-227679 (Publication date: Nov. 7, 2013)

SUMMARY OF THE INVENTION

With the vapor deposition mask of Patent Literature 1, however, each of the slits in the metallic mask overlies a plurality of the apertures in the resin mask. As such, no portion of the metallic mask exists between apertures which coincide with the same single slit. This means that, between those of the apertures which coincide with the same single slit, there is insufficient force to bring the target substrate and the vapor deposition mask into close contact, and the vapor deposition mask separates from the target substrate. This presents the risk of a reduction in the precision of the vapor deposition pattern.

Note that Patent Literature 1 also discloses providing a bridge to divide a slit. The bridge is, however, provided such that even after division by the bridge, a slit still overlies a plurality of apertures. As such, the above problem remains even when the bridge is employed.

Furthermore, in Patent Literature 1, the bridge is provided in order to increase the rigidity of the metallic mask. As such, Patent Literature 1 merely specifies a width of the bridge necessary to increase the rigidity of the metallic mask, and fails make any mention of, for example, a cross-sectional shape of the bridge.

In a configuration where such a bridge is provided in a slit, vapor deposition particles emitted from a vapor deposition source run into an inner wall of the bridge. As such, a portion of the vapor deposition particles which are travelling toward an aperture on an adjacent side of the bridge will be blocked. This results in the occurrence of a vapor deposition shadow in which incompletely vapor deposited portions exist on the target substrate, the incompletely deposited portions having a thickness less than the intended thickness of the vapor-deposited film.

Note that, generally, vapor deposition particles travel from every direction. As such, it is necessary to prevent a vapor deposition shadow in all directions.

In a configuration using a bridge, there is therefore the risk that, in order to prevent the occurrence of a vapor deposition shadow, it will be necessary to restrict, across the entirety of the vapor deposition mask, the angle from which vapor deposition particles travel.

Furthermore, a configuration using a bridge reduces not only the precision of the vapor deposition pattern, but also the efficiency of utilization of vapor deposition particles.

The present invention was made in view of the above problems. An object of the present invention is to provide (i) a vapor deposition mask, (ii) a vapor deposition device, (iii) a vapor deposition method, and (iv) a method of producing a vapor deposition mask, each of which makes it possible to (i) inhibit a reduction in the efficiency of utilization of vapor deposition particles and (ii) increase the precision of a vapor deposition pattern.

In order to solve the above problems, a vapor deposition mask in accordance with an aspect of the present invention is a vapor deposition mask for forming a vapor-deposited film, in a matrix, on a target substrate, the vapor deposition mask including: a mask substrate; and a magnetic material section provided on a first main surface of the mask substrate, the mask substrate including a plurality of apertures constituting (i) first aperture lines, each constituted by ones of the plurality of apertures which ones are lined up in a first direction and (ii) second aperture lines, each constituted by ones of the plurality of apertures which ones are lined up in a second direction orthogonal to the first direction, the magnetic material section being provided so as to be (iii) interposed between the first aperture lines and (iv) interposed between the second aperture lines, a first portion of the magnetic material, which first portion is interposed between the second aperture lines, having a first thickness and a second thickness which is less than the first thickness, the first thickness of the first portion being that of each sub-portion thereof which is positioned between mutually adjacent ones of the first aperture lines, the second thickness of the first portion being that of each sub-portion thereof which is positioned between ones of the plurality of apertures which ones are mutually adjacent in the first direction.

In order to solve the above problems, a vapor deposition device in accordance with an aspect of the present invention includes: the above a vapor deposition mask; a magnetic force generating source provided opposite from the vapor deposition mask with respect to the target substrate, the magnetic force generating source causing the vapor deposition mask to come into contact with the target substrate by magnetically attracting the magnetic material section; and a vapor deposition source which emits vapor deposition particles toward the vapor deposition mask.

In order to solve the above problems, a vapor deposition method in accordance with an aspect of the present invention is a vapor deposition method for forming a vapor-deposited film, in a matrix, on a target substrate by use of the above vapor deposition device, the vapor deposition method including the steps of: (a) causing the target substrate and the vapor deposition mask to face each other and, thereafter, causing the vapor deposition mask to come into contact with the target substrate by using the magnetic force generating source to magnetically attract the magnetic material section; and (b) forming the vapor-deposited film on the target substrate, while the vapor deposition mask and the target substrate have been brought into contact with each other via magnetic force, by depositing vapor deposition particles onto the target substrate while concurrently causing at least one of the group consisting of (i) the target substrate, being in contact with the vapor deposition mask, and (ii) the vapor deposition source to move in the first direction.

In order to solve the above problems, a method of producing a vapor deposition mask in accordance with an aspect of the present invention includes the steps of: (a) preparing a laminated body in which a magnetic material film is laminated onto a first main surface of a mask substrate; (b) forming a magnetic material section by etching the magnetic material film such that the magnetic material section includes main line sections, each of which is in the form of a stripe extending in a first direction, branch sections which extend, in parallel with a second direction orthogonal to the first direction, from each side of each of the main line sections, and island sections, each of which is provided so as to be (i) between ones of the branch sections which ones extend toward each other and (ii) separate from the main line sections and the branch sections, each of the island sections having a thickness which is less than that of (i) each of the branch sections and (ii) each portion of each of the main line sections which portion is positioned on a line passing through (i) one of the island sections and (ii) one of the branch sections adjacent to the one of the island sections; and (c) forming apertures such that each of the apertures is in a respective region surrounded by respective ones of the main line sections, the branch sections, and the island sections.

In order to solve the above problems, a method of producing a vapor deposition mask in accordance with an aspect of the present invention includes the steps of: (a) preparing a laminated body which includes, in the following order, a mask substrate, a first magnetic material film on a first main surface of the mask substrate, and a second magnetic material film; (b) etching the second magnetic material film such that the second magnetic material film has a matrix pattern in which non-continuous portions of the second magnetic material film are lined up in a first direction and in a second direction orthogonal to the first direction; and (c) forming apertures in respective positions such that each portion of the second magnetic material film, having been patterned, falls along a line passing diagonally through one of the apertures.

The vapor deposition mask includes a magnetic material section which is interposed between each of the aperture lines (that is, between each of the apertures). This configuration makes it possible, even in a case where the mask substrate is made from a non-magnetic material which is a non-metal material, to magnetically attract the vapor deposition mask, thereby (i) preventing the vapor deposition mask from separating from an area surrounding each of the apertures and (ii) reliably securing close contact between the target substrate and the vapor deposition mask. Furthermore, a first portion of the magnetic material, which first portion is interposed between the second aperture lines, has a first thickness and a second thickness which less than the first thickness, the first thickness of the first portion being that of each sub-portion thereof which is positioned between mutually adjacent ones of the first aperture lines, the second thickness of the first portion being that of each sub-portion thereof which is positioned between ones of the apertures which ones are mutually adjacent in the first direction. This makes it possible for vapor deposition particles travelling with respect to the first direction to enter the apertures from a greater angle than vapor deposition particles travelling diagonally.

An aspect of the present invention therefore makes it possible to provide (i) a vapor deposition mask, (ii) a vapor deposition device, (iii) a vapor deposition method, and (iv) a method of producing a vapor deposition mask, each of which makes it possible to (i) inhibit a reduction in the efficiency of utilization of vapor deposition particles and (ii) increase the precision of a vapor deposition pattern.

Figure 1:
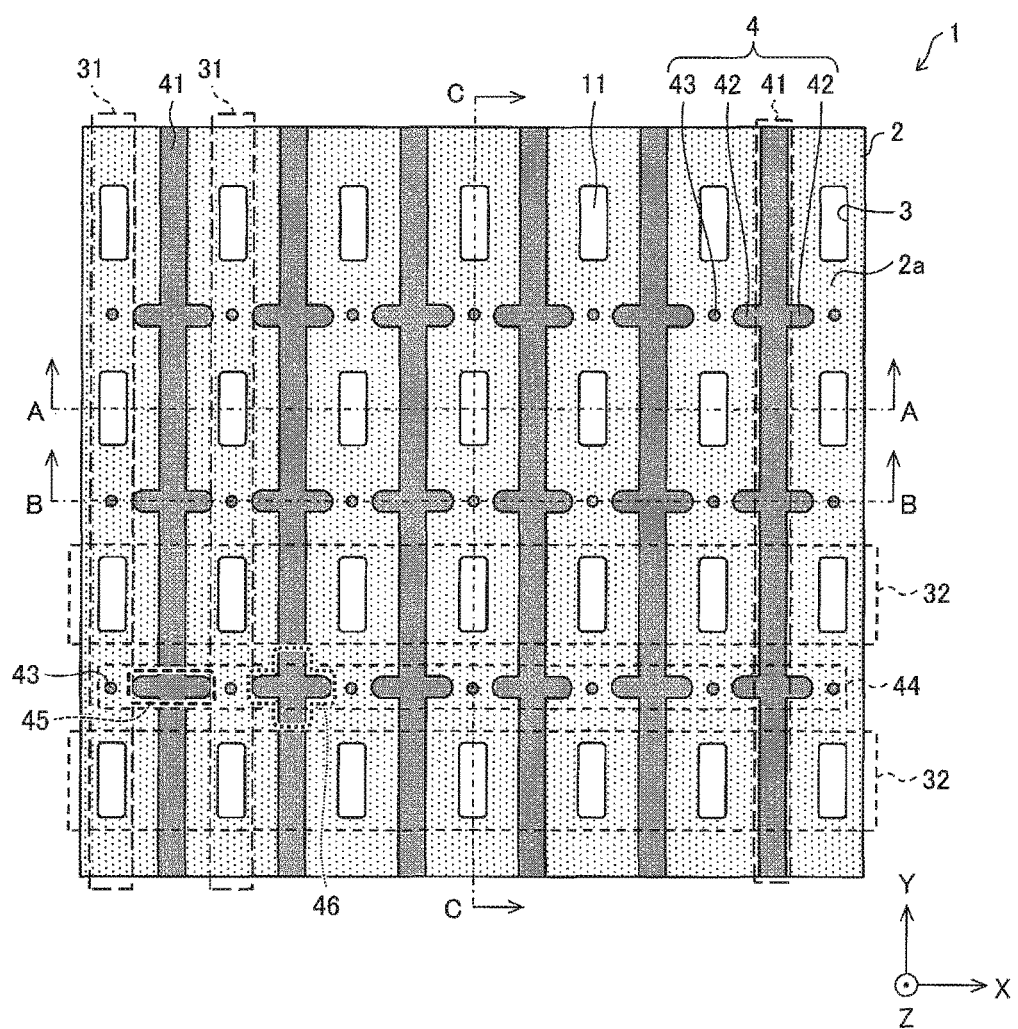
FIG. 1 is a plan view which schematically illustrates (i) a configuration of a vapor deposition mask in accordance with Embodiment 1 of the present invention and (ii) a vapor-deposited film formed by using the vapor deposition mask 1.
Figure 2:
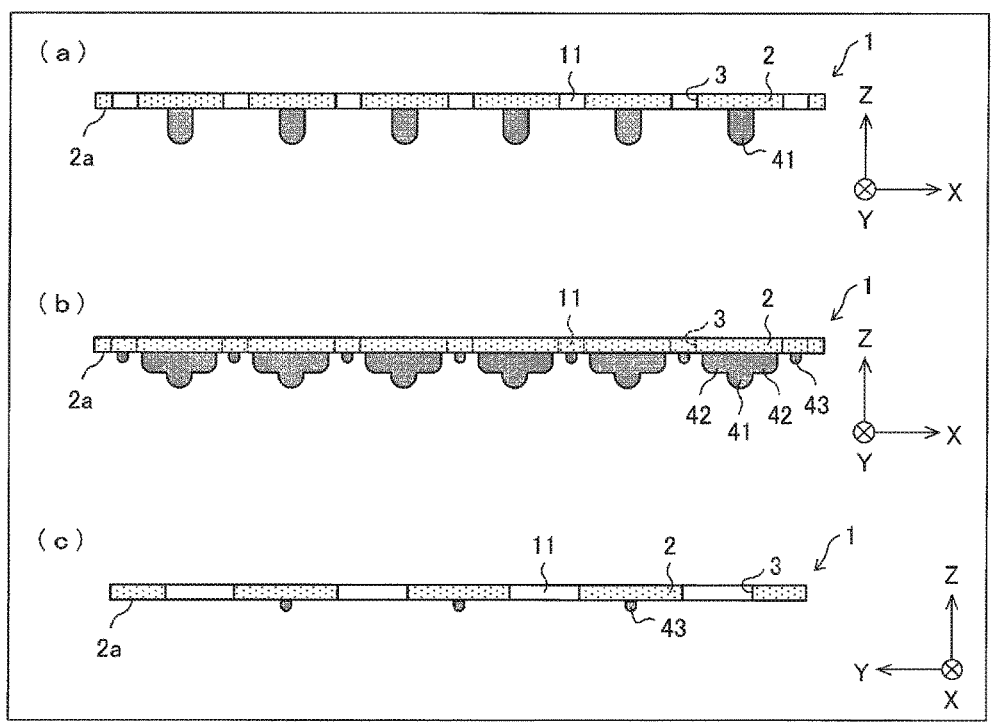

(a) through (c) of FIG. 2 are each a cross-sectional view which schematically illustrates (i) a configuration of the vapor deposition mask in accordance with Embodiment 1 of the present invention and (ii) the vapor-deposited film formed by using the vapor deposition mask 1. (a) of FIG. 2 is a cross-sectional view taken along the line A-A of FIG. 1; (b) of FIG. 2 is a cross-sectional view taken along the line B-B of FIG. 1; and (c) of FIG. 2 is a cross-sectional view taken along the line C-C of FIG. 1.

Figure 3:
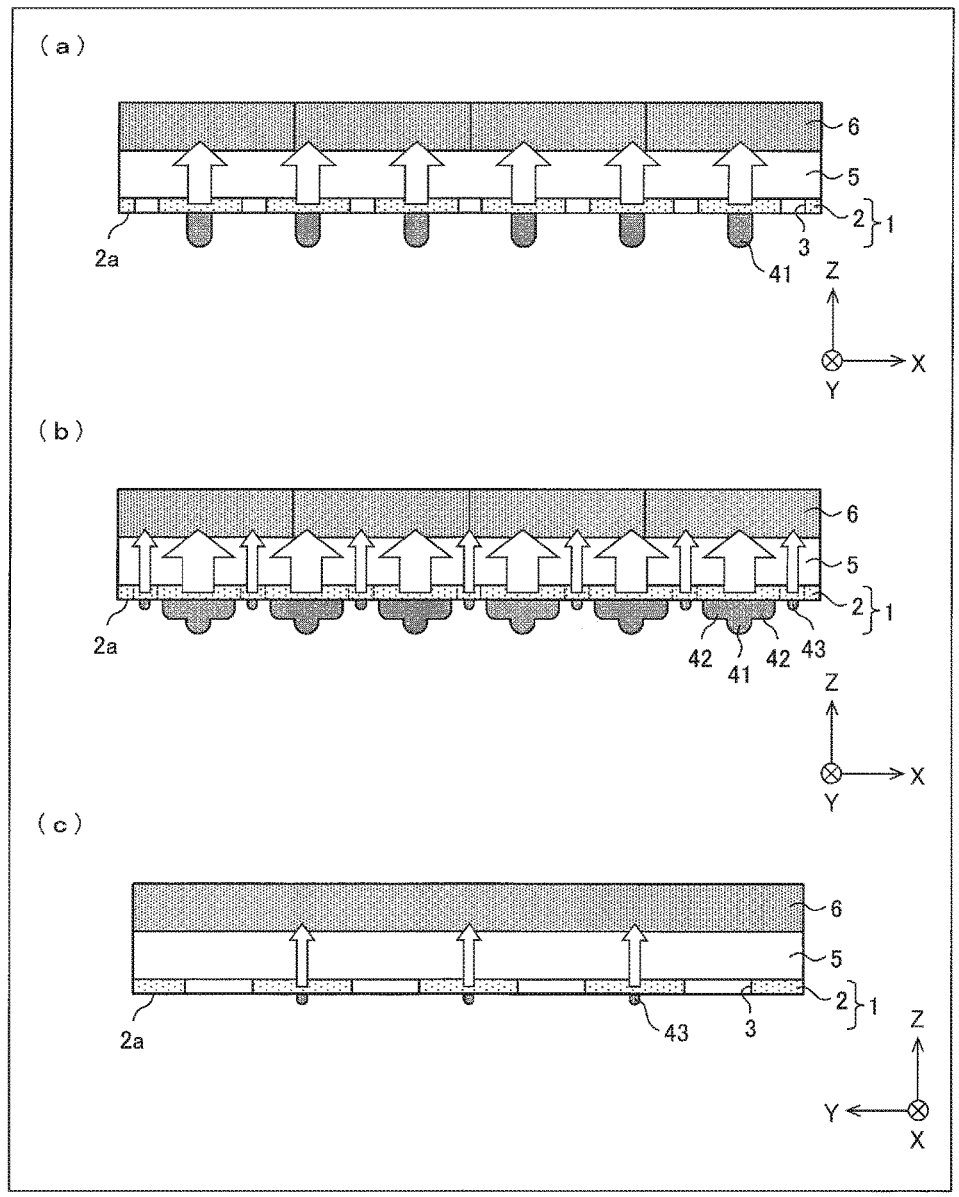

(a) through (c) of FIG. 3 are each a cross-sectional view which illustrates a vapor deposition mask and which is used for explaining a magnetic force applied to the vapor deposition mask in accordance with Embodiment 1 of the present invention.

Figure 4:
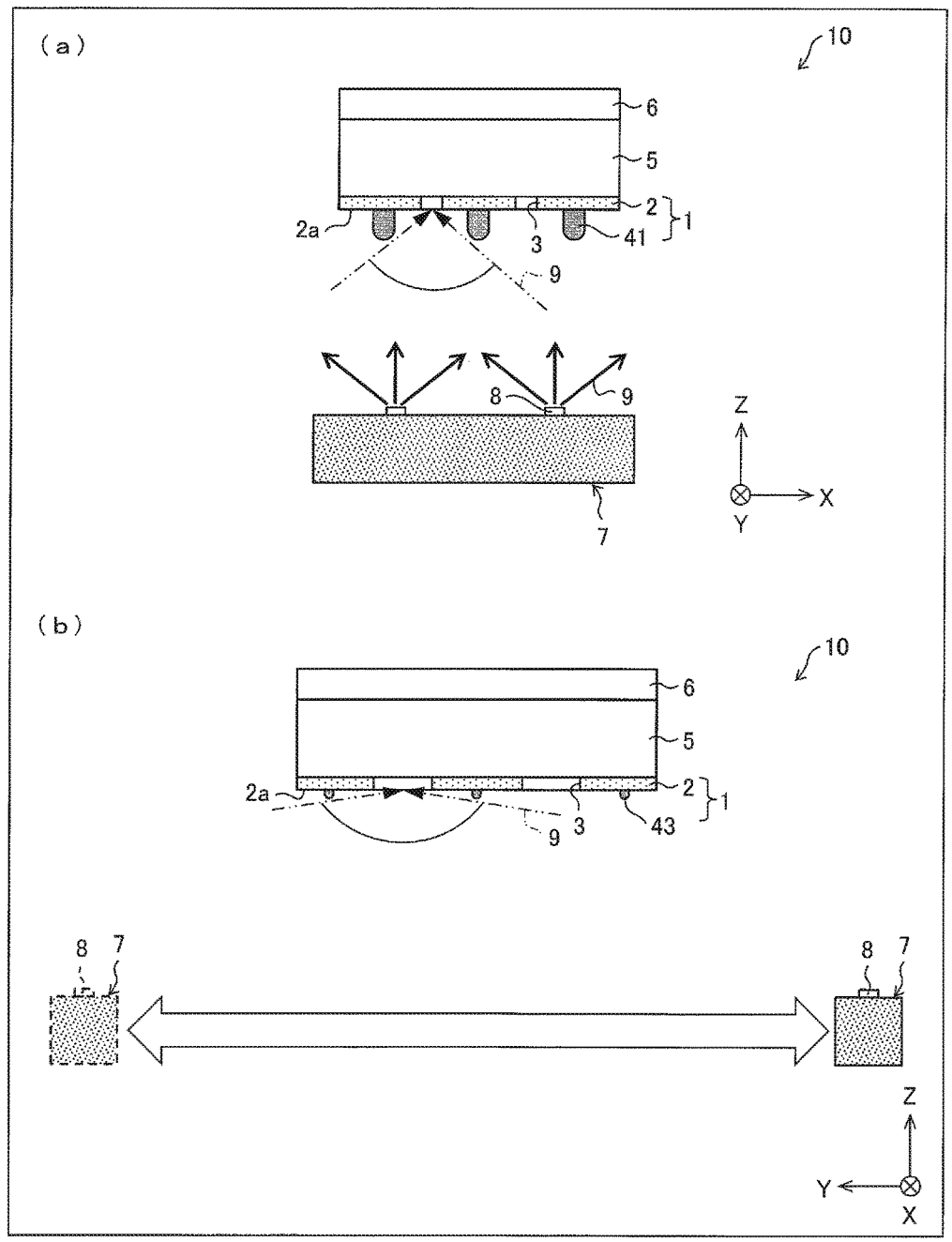

(a) and (b) of FIG. 4 are each a cross-sectional view of major components of a vapor deposition device 10 employing the vapor deposition mask in accordance with Embodiment 1 of the present invention, the views being for describing a vapor deposition shadow in the vapor deposition device 10.

Figure 5:
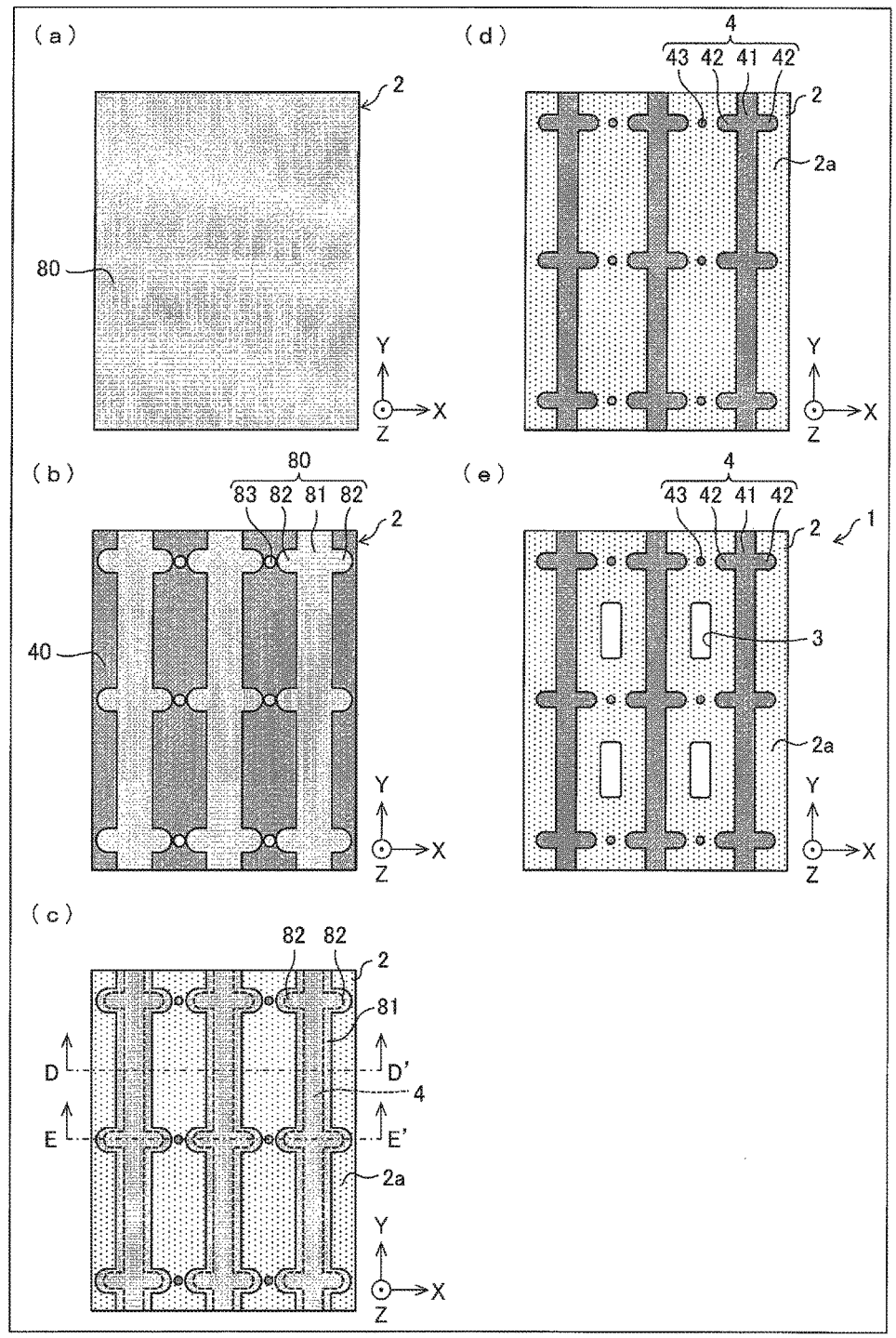

(a) through (e) of FIG. 5 are plan views illustrating the order of steps for producing a vapor deposition mask.

Figure 6:
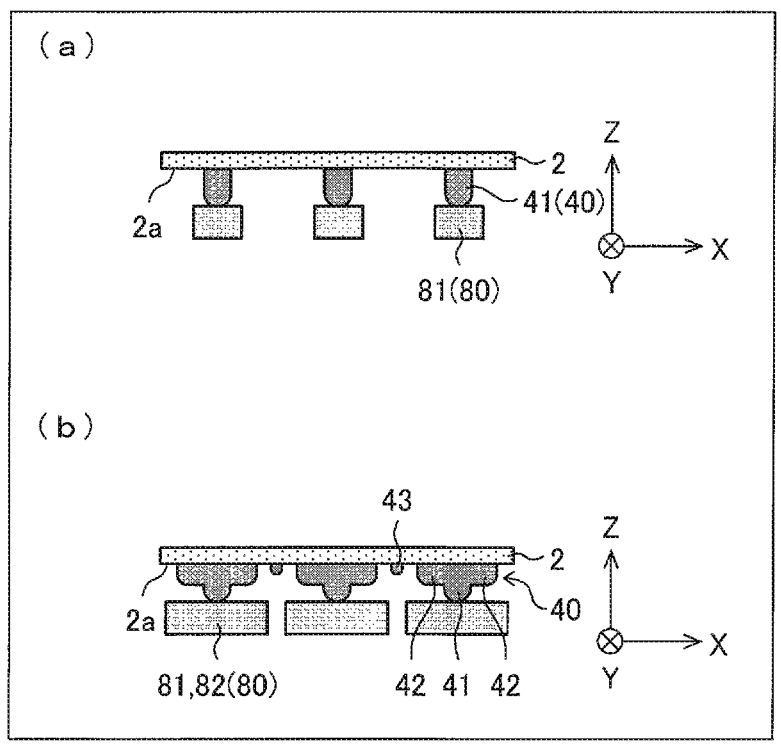

(a) of FIG. 6 is a cross-sectional view taken along the line D-D of (c) of FIG. 5, and (b) of FIG. 6 is a cross-sectional view taken along the line E-E of (c) of FIG. 5.

Figure 7:
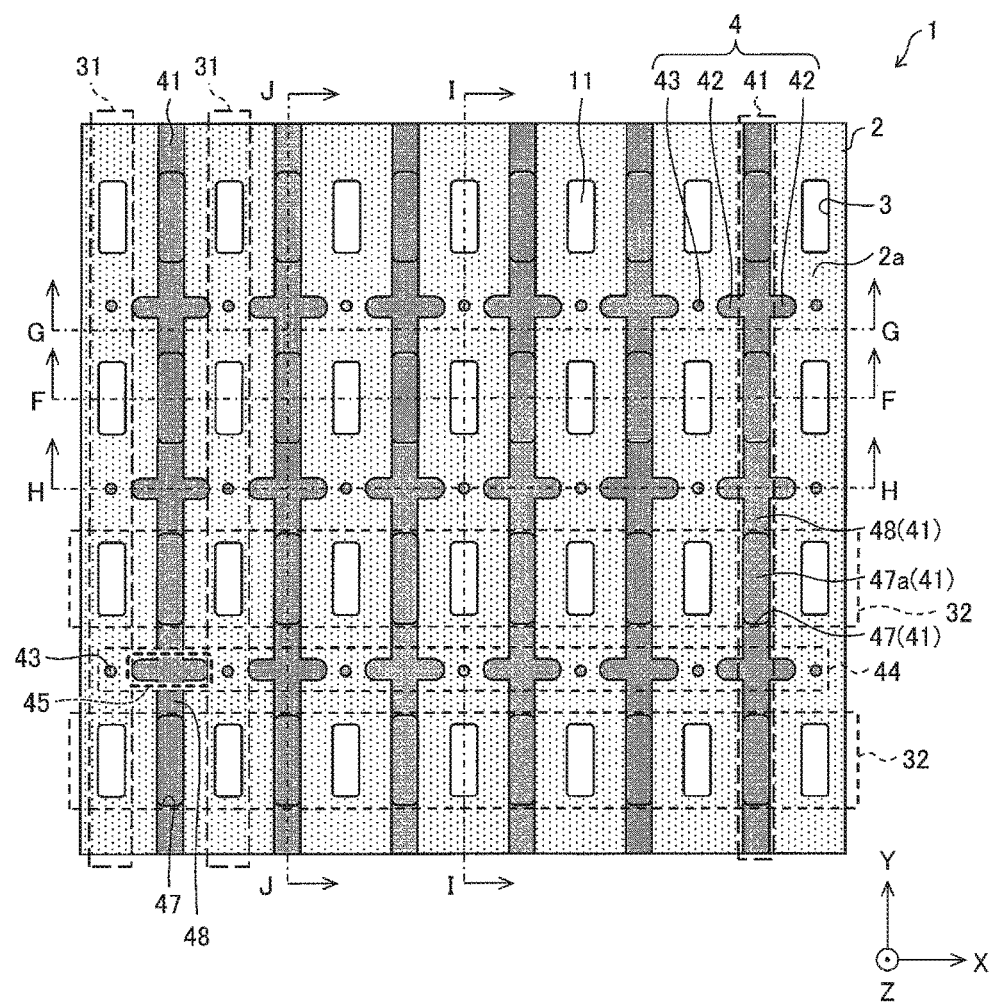

FIG. 7 is a plan view which schematically illustrates (i) a configuration of a vapor deposition mask in accordance with Embodiment 2 of the present invention and (ii) a vapor-deposited film formed by using the vapor deposition mask 1.

Figure 8:
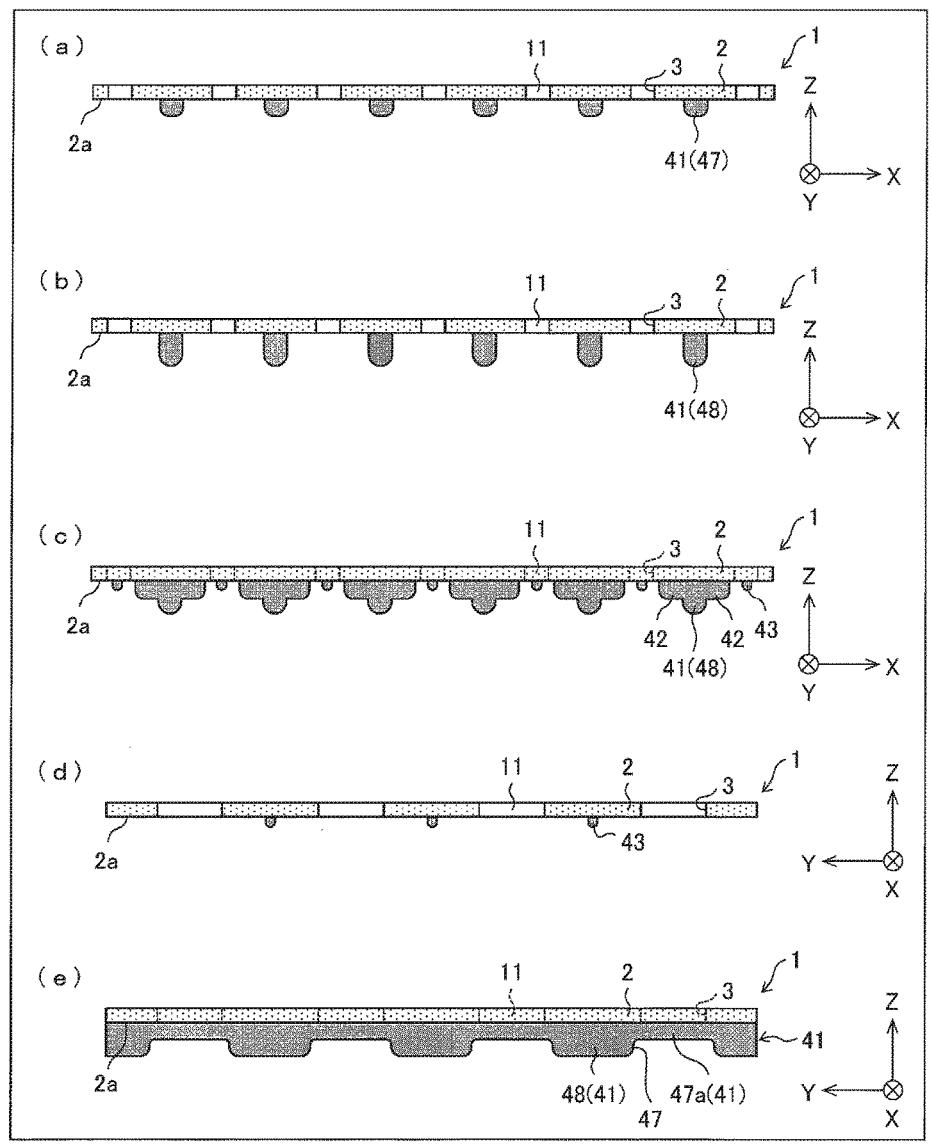

(a) through (e) of FIG. 8 are each a cross-sectional view which schematically illustrates (i) a configuration of the vapor deposition mask in accordance with Embodiment 2 and (ii) a vapor-deposited film formed by using the vapor deposition mask 1. (a) of FIG. 8 is a cross-sectional view taken along the line F-F of FIG. 7; (b) of FIG. 8 is a cross-sectional view taken along the line G-G of FIG. 7; (c) of FIG. 8 is a cross-sectional view taken along the line H-H of FIG. 7; (d) of FIG. 8 is a cross-sectional view taken along the line I-I of FIG. 7; and (e) of FIG. 8 is a cross-sectional view taken along the line J-J of FIG. 7.

Figure 9:
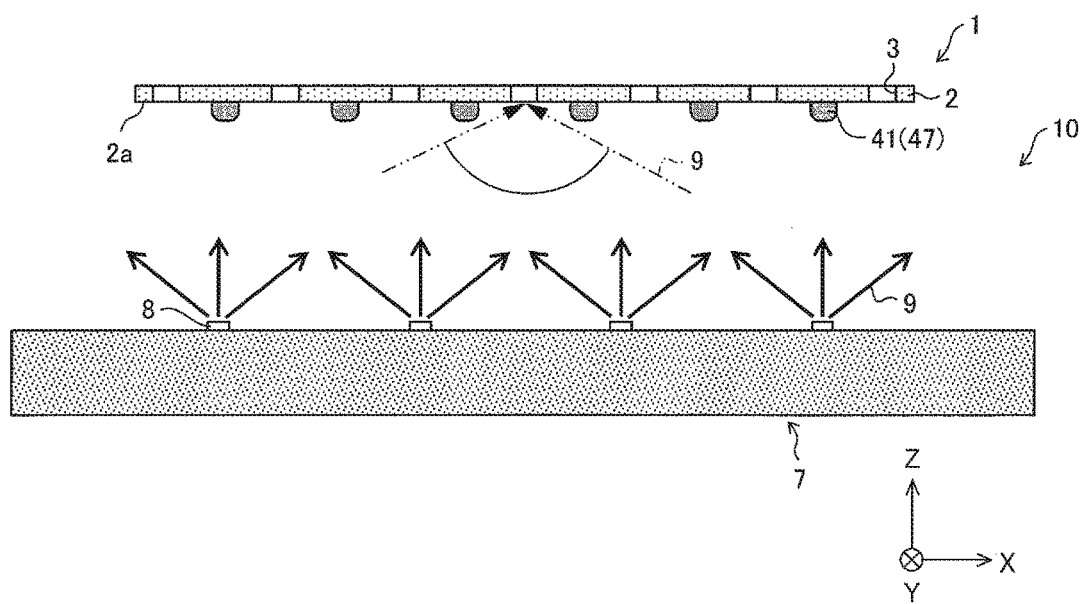

FIG. 9 is a cross-sectional view of major components of the vapor deposition device 10, the view being for describing a vapor deposition shadow occurring with the vapor deposition mask in accordance with Embodiment 2.

Figure 10:
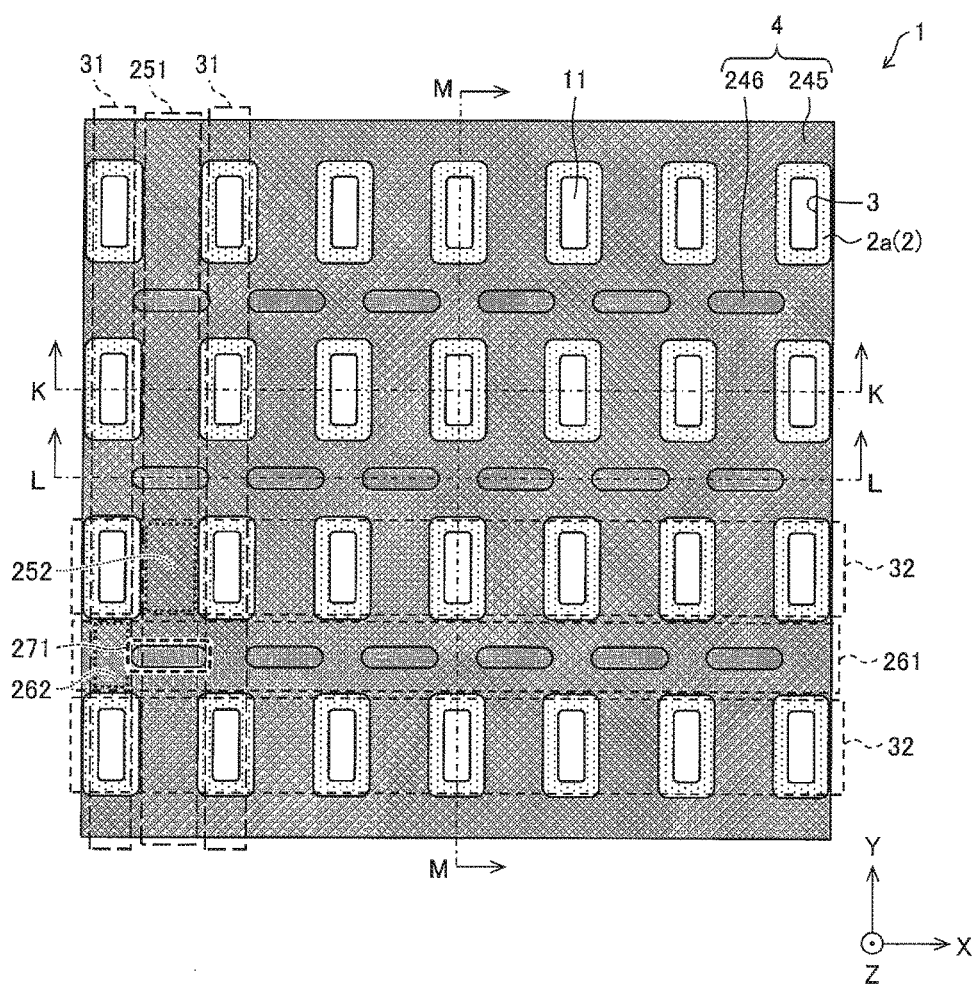

FIG. 10 is a plan view which schematically illustrates (i) a configuration of a vapor deposition mask in accordance with Embodiment 3 of the present invention and (ii) a vapor-deposited film formed by using the vapor deposition mask 1.

Figure 11:
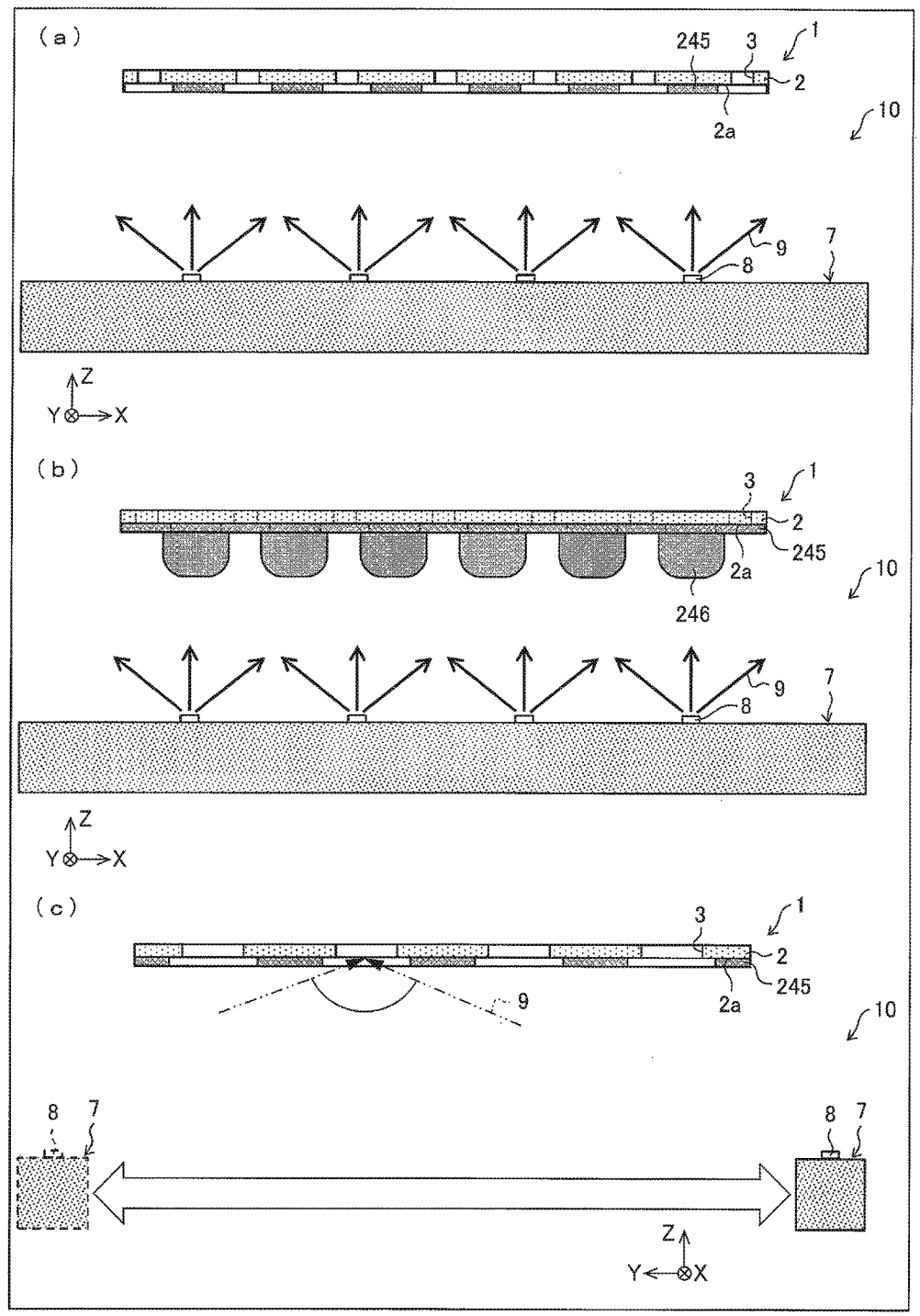

(a) through (c) of FIG. 11 are each a cross-sectional view of major components of a vapor deposition device, the view being for describing a vapor deposition shadow occurring with the vapor deposition mask in accordance with Embodiment 3 of the present invention.

Figure 12:
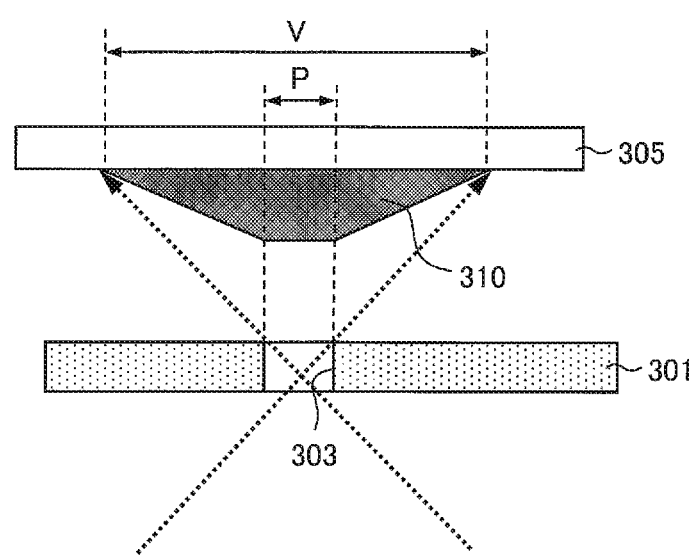

FIG. 12 is a cross-sectional view of a target substrate and a vapor deposition mask, the view being for explaining problems occurring with a conventional vapor deposition method.

Figure 13:
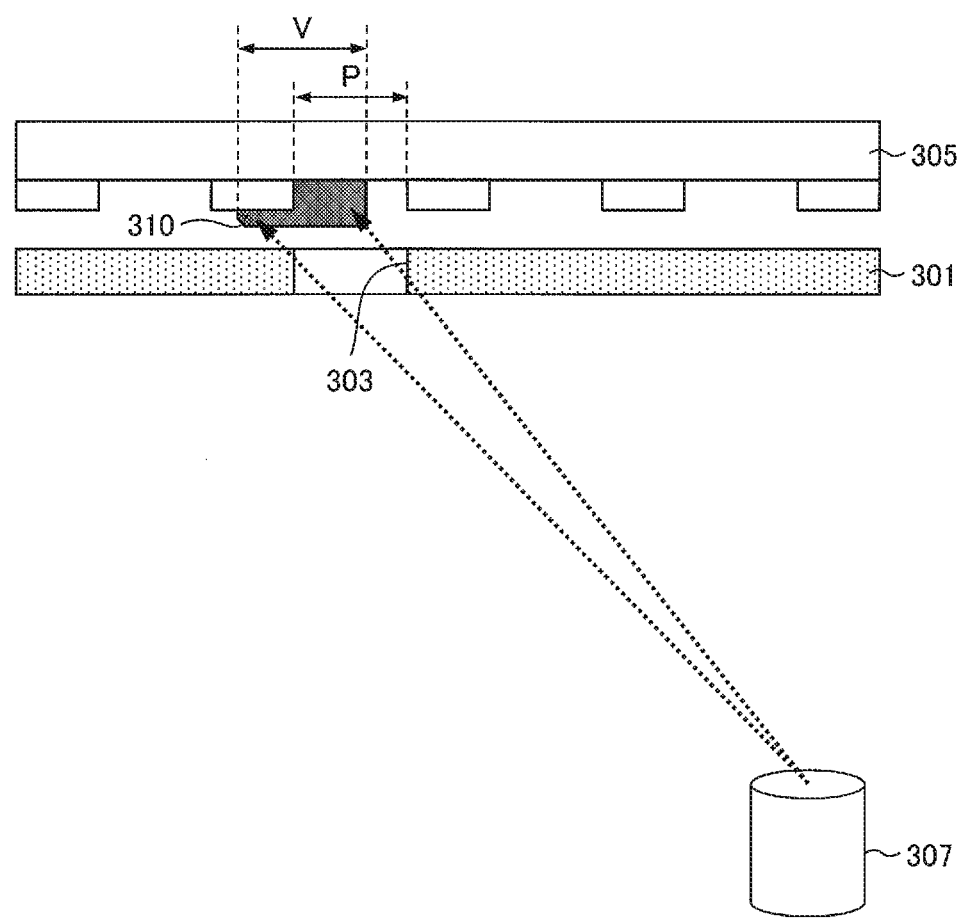

FIG. 13 is a cross-sectional view of a target substrate and a vapor deposition mask, the view being for explaining problems occurring with a conventional vapor deposition method.

DETAILED DESCRIPTION OF THE INVENTION

The following description will discuss, in detail, embodiments of the present invention.

The following description will discuss an embodiment of the present invention, with reference to FIG. 1 through (a) and (b) of FIG. 6.

[Main Configuration of Vapor Deposition Mask 1]

FIG. 1 is a plan view which schematically illustrates (i) a configuration of a vapor deposition mask 1 in accordance with Embodiment 1 of the present invention and (ii) a vapor-deposited film 11 formed by using the vapor deposition mask 1.

The vapor deposition mask 1 is included in a vapor deposition device and is used for forming the vapor-deposited film 11 in a matrix (matrix pattern) on a surface of a target substrate 5 (see (a) through (c) of FIG. 3).

The vapor deposition mask 1 includes (i) a mask substrate 2 constituting a mask body and (ii) a magnetic material section 4 (magnetic material layer) provided on a main surface 2a (first main surface) of the mask substrate 2.

The main surface of the mask substrate 2 has a plurality of apertures 3 (through holes) provided in a matrix arrangement. As illustrated in FIG. 1, Y aperture lines 31 (first aperture lines) are each constituted by apertures 3 lined up in a Y direction (first direction), while X aperture lines 32 (second aperture lines) are each constituted by apertures 3 lined up in an X direction (second direction) orthogonal to the Y direction. A plurality of the Y aperture lines 31 are provided along the X direction, and a plurality of the X aperture lines 32 are provided along the Y direction.

The magnetic material section 4 is formed so as to be (i) interposed between the Y aperture lines 31 and (ii) interposed between the X aperture lines 32. Furthermore, a first portion of the magnetic material section 4, which first portion is interposed between the X aperture lines 32, has a first thickness and a second thickness which is less than the first thickness. The first thickness of the first portion is that of each sub-portion thereof positioned between mutually adjacent ones of the Y aperture lines 31, and the second thickness of the first portion is that of each sub-portion thereof which is positioned between ones of the apertures 3 which ones are mutually adjacent in the Y direction.

The following description will discuss this configuration in more detail.

The magnetic material section 4 suitably surrounds each of the apertures 3 and is formed so as to be distanced from each of the apertures 3.

The magnetic material section 4 is formed in a substantially grid-like pattern, which pattern includes narrow portions in which (i) line width of the magnetic material section 4 and (ii) thickness of the magnetic material section 4 differ in the X direction.

More specifically, the magnetic material section 4 includes (i) main line sections 41 (magnetic material main line sections, main-line-shaped magnetic material sections) each in the form of a stripe extending in the Y direction, (ii) branch sections 42 (magnetic material branch sections, branch-shaped magnetic material sections) which extend, in parallel with the X direction, from each side of each of the main line sections 41, and (iii) island sections 43 (magnetic material island sections, island-like magnetic material sections), each of which is provided between ones of the branch sections 42 which ones extend toward each other from mutually adjacent ones of the main line sections 41. Each of the island sections 43 is provided so as to be separate from the main line sections 41 and the branch sections 42.

The main line sections 41 are each formed in a region between mutually adjacent ones of the Y aperture lines 31. The main line sections 41 are each formed so as to (i) be interposed between mutually adjacent ones of the Y aperture lines 31 and (ii) extend in the Y direction.

The branch sections 42 and the island sections 43 are lined up in the X direction and are each formed in a region between mutually adjacent ones of the X aperture lines 32.

More specifically, (i) the branch sections 42, (ii) a portion of each of the main line sections 41 which portion serves as a base of the branch sections 42, and (iii) the island sections 43 are positioned in a rectilinear manner in parallel with the X aperture lines 32. Linear pattern sections 45 are each constituted by (i) a pair of the branch sections 42 and (ii) a portion of a respective one of the main line sections 41 which portion serves as a base for the pair of the branch sections 42. The island sections 43 are each provided between mutually adjacent ones of the linear pattern sections 45.

With this configuration, magnetic material lines 44 are formed along the X direction so as to be interposed between mutually adjacent ones of the X aperture lines 32. Each of the magnetic material lines is constituted by linear pattern sections 45 and island sections 43.

That is, the magnetic material section 4 is formed on the main surface 2a of the mask substrate 2 and includes (i) main line sections 41 which each (a) extend in the Y direction and (b) are interposed between mutually adjacent ones of the Y aperture lines 31 and (ii) magnetic material lines 44 which each (c) extend in the X direction and (d) are interposed between mutually adjacent ones of the X aperture lines 32. The main line sections 41 and the magnetic material lines 44 are provided so as to form a grid-like pattern when viewed from above.

Furthermore, each of the linear pattern sections 45 has X direction-wise ends (that is, ends of the branch section 42 which ends are positioned opposite from the portion of the main line sections 41 which portion forms the base of the branch sections 42) which are formed so as to be curvilinear when viewed from above. The island sections 43 each have a line width which is less than that of each of the linear pattern sections 45. Each of the island sections 43 has a thickness which is less than that of (i) the portion of each of the main line sections 41 which portion is included in one of the linear pattern sections 45 and (ii) each of the branch sections 42, which are also included in the linear pattern sections 45. With this configuration, portions of the magnetic material section 4 provided along the X direction (these portions being the magnetic material lines 44) include (i) the X direction-wise ends of the branch sections 42 and (ii) the island sections 43, and therefore have narrow portions each having a line width and thickness differing from other portions of the magnetic material section 4.

A mask substrate 2 (nonmagnetic mask section, nonmetallic mask section) made from a nonmagnetic material is suitably employed as the mask substrate 2. Examples of the nonmagnetic mask section (nonmetallic mask section) employed as the mask substrate 2 include a resin mask, a ceramic mask, and a laminated mask (composite mask) which consists of a resin mask portion and a ceramic mask portion laminated together.

In this way, the mask substrate 2 can employ a material which is the same as that used as a base material (mask substrate) of a vapor deposition mask made from a nonmagnetic material, such as resin or a ceramic material.

A resin which can be used as the material of the mask substrate 2 is not particularly limited. A resin such as that used in a known resin mask can be employed.

Examples of the resin include polyimide, polyethylene, polyethylene naphthalate, polyethylene terephthalate, and epoxy resin. These resins can each be used alone or in combinations of two or more.

That is, the mask substrate 2 can be configured so as to include a plurality of layers of these resins, and the mask substrate 2 can alternatively be made from a resin composition containing these resins.

A base material of the resin mask can be a resin film (high molecular weight film) or a resin substrate (plastic substrate).

The magnetic material section 4 can be made from a material such as that used as a base material of a known metallic mask.

Examples of the material of the magnetic material section 4 include metal materials (magnetic metal materials) such as iron, nickel, invar (an iron-nickel alloy), and SUS430. Out of these, invar in particular can be used suitably, since it exhibits little heat-induced deformation.

The mask substrate 2 of Embodiment 1 is, as described above, made from a non-metal material. This configuration makes it possible, in comparison to a vapor deposition mask consisting of a metallic mask, to increase the precision of positioning of patterned apertures. It is therefore possible to form the apertures 3 in the mask substrate 2 with high precision.

With the above configuration, the mask substrate 2 is either a nonmagnetic material or is only weakly magnetic. This means that, similarly to a conventional vapor deposition mask made from a nonmagnetic material, the mask substrate 2 cannot, by itself, ensure close contact with the target substrate 5 via magnetic force.

Note, however, that the vapor deposition mask 1 of Embodiment 1 includes a magnetic material section 4 provided on the mask substrate 2, as described above. This makes it possible to attract the magnetic material section 4 toward the target substrate 5 by use of a magnetic force generating source 6 (see (a) through (c) of FIG. 3) provided on the same side as the target substrate 5. It is thereby possible to cause the vapor deposition mask 1 and the target substrate 5 to be in close contact.

Furthermore, the magnetic material section 4 is formed so as to surround each of the apertures 3. As such, it is possible to deposit the vapor deposition particles 9 (see (a) and (b) of FIG. 4) onto the target substrate 5 while the vapor deposition mask 1, and in particular, those portions peripheral to the apertures 3, is in a state of close contact with the target substrate 5. This makes it possible to enhance the precision of the vapor deposition pattern in a vapor deposition process which uses the vapor deposition mask 1 to form the vapor-deposited film 11.

[Thickness of Mask Substrate 2 and Magnetic Material Section 4]

With regards to thickness, the mask substrate 2 of Embodiment 1 is preferably thin. Setting the thickness of the mask substrate 2 so as to be thin makes it possible to inhibit the occurrence of a vapor deposition shadow. As such, the mask substrate 2 has a thickness which preferably falls within a range from 5 µm to 30 µm, and is more preferably not more than 5 µm. Note, however, that configuring the mask substrate 2 to be too thin causes a reduction in the strength of the vapor deposition mask 1. As such, it is preferable to set the thickness of the mask substrate 2 such that the vapor deposition mask 1 maintains an adequate strength.

Setting the magnetic material section 4 to be thick increases the force with which the magnetic material section 4 is magnetically attracted toward the target substrate 5. This improves the degree to which the vapor deposition mask 1 and the target substrate 5 are in close contact. Setting the magnetic material section 4 to be too thick, however, will cause a vapor deposition shadow to occur. As such, the magnetic material section 4 has a thickness which preferably falls within a range from 20 µm to 100 µm, and is more preferably not more than 50 µm.

Note that the magnetic material section 4 of Embodiment 1 is formed so as to (i) be interposed between the Y aperture lines 31, (ii) be interposed between X aperture lines 32, and (iii) have the island sections 43, of the magnetic material lines 44, each having a thickness which is less than that of each of the linear pattern sections 45. That is, a portion of the magnetic material section 4 interposed between the X aperture lines 32 has a first thickness and a second thickness which is less than the first thickness, the first thickness being that of each sub-portion positioned in an area between mutually adjacent ones of the Y aperture lines 31, the second thickness being that of each sub-portion positioned between ones of the apertures 3 which ones are mutually adjacent in the Y direction (i.e., between apertures 3 in a Y aperture line 31 which apertures 3 are mutually adjacent).

The following description will discuss the respective thicknesses of the various portions (regions) of the magnetic material section 4.

[Thicknesses of Various Portions of Magnetic Material Section 4]

(a) through (c) of FIG. 2 are each a cross-sectional view which schematically illustrates (i) a configuration of the vapor deposition mask 1 in accordance with Embodiment 1 of the present invention and (ii) the vapor-deposited film formed by using the vapor deposition mask 1. (a) of FIG. 2 is a cross-sectional view taken along the line A-A of FIG. 1; (b) of FIG. 2 is a cross-sectional view taken along the line B-B of FIG. 1; and (c) of FIG. 2 is a cross-sectional view taken along the line C-C of FIG. 1.

The dotted lines in (b) of FIG. 2 indicate positions of the apertures 3 which are located in a depth-wise direction of the diagram. As illustrated in FIG. 1 and (b) of FIG. 2, portions of the magnetic material section 4 which portions are formed in a region between mutually adjacent one of the X aperture lines 32 are formed in a region between ones of the apertures 3 which ones are mutually adjacent in the Y direction.

As illustrated in (a) through (c) of FIG. 2, the magnetic material section 4 has a thickness (a height as measured from the mask substrate 2) which differs depending on the position. Specifically, the branch sections 42 each have a thickness which is less than that of each of the main line sections 41, and the island sections 43 each have a thickness which is less than that of each of the branch sections 42.

As illustrated in FIG. 1 and (b) of FIG. 2, in a region between mutually adjacent one of the X aperture lines 32, the main line sections 41, the branch sections 42, and the island sections 43 are formed along the X direction. As such, the thickness of the magnetic material section 4 changes in a cyclically repeating pattern along the X direction in accordance with the position of the apertures 3.

A more specific description is as follows. Portions of the magnetic material section 4 in a region between the X aperture lines 32 have a cyclically repeating protruding shape. The main line sections 41 and the branch sections 42 constitute protruding sections, and the island sections 43 are formed so as to be separate from and between these protruding sections, specifically, at intermediate points between mutually adjacent ones of the protruding sections.

The thickness of each of the island sections 43 (i.e., the thickness of each portion of the magnetic material section 4 positioned between ones of the apertures 3 which ones are mutually adjacent in the Y direction) is less than that of each of the main line sections 41 and the branch sections 42 of magnetic material lines 44 positioned between the X aperture lines 32 (i.e., less than the thickness of each of the linear pattern sections 45).

That is, the island sections 43 each have a thickness which is less than that of each portion (region 46) of the magnetic material section 4 which is (i) constituted by (a) a portion of one of the main line sections 41 and (b) the branch sections 42 and (ii) located in a region that is both (c) between X aperture lines 32 and (d) between mutually adjacent ones of the Y aperture lines 31.

In other words, the thickness of each of the island sections 43 is less than that of (i) each portion of each of the main line sections 41 which portion is in a region between mutually diagonally adjacent ones of the apertures 3 and (ii) the branch sections 42 in the same region. Specifically, the thickness of each of the island sections 43 is less than that of each of the linear pattern sections 45 and each of the regions 46 of the magnetic material section 4.

As such, with regards to the thickness of the magnetic material section 4 along the X direction, each portion of the magnetic material section 4 which is formed in a region between mutually adjacent ones of the X aperture lines 32 has a thickness which decreases as proximity to the apertures 3 increases.

[Force of Attraction]

(a) through (c) of FIG. 3 are each a cross-sectional view which illustrates the vapor deposition mask 1 and which is for describing a magnetic force applied to the vapor deposition mask 1. (a) of FIG. 3 is a cross-sectional view taken along the line A-A of FIG. 1; (b) of FIG. 3 is a cross-sectional view taken along the line B-B of FIG. 1; and (c) of FIG. 3 is a cross-sectional view taken along the line C-C of FIG. 1.

Note that in each of (a) through (c) of FIG. 3, the direction and thickness of arrows indicate the direction and magnitude, respectively, of the magnetic force applied to the vapor deposition mask 1.

As illustrated in (a) through (c) of FIG. 3, in a vapor deposition process, the vapor deposition mask 1 is caused to face a vapor deposition surface of the target substrate 5, and the magnetic force generating source 6 is provided on a side of the target substrate 5 which side faces away from the vapor deposition surface (a back side of the target substrate 5).

Because the vapor deposition mask 1 includes the magnetic material section 4, it is possible to attract the vapor deposition mask 1 toward the target substrate 5 by providing the magnetic force generating source 6 on the back side of the target substrate 5. This makes it possible to bring the vapor deposition mask 1 and the target substrate 5 into close contact with each other.

Furthermore, the magnetic material section 4 is provided so as to substantially surround each of the apertures 3. As such, magnetic force is applied to areas surrounding each of the apertures 3, thereby making it possible to bringing the areas surrounding each of the apertures 3 into close contact with the target substrate 5.

As described above, using a non-metal material, such as resin or a ceramic material, as the material of the mask substrate 2 makes it possible to form the apertures 3 in the mask substrate 2 with high precision. Furthermore, carrying out vapor deposition while the vapor deposition mask 1 and the target substrate 5 are in close contact makes it possible to effectively utilize the potential of the apertures 3 formed with high precision. This makes it possible to enhance the precision of the vapor deposition pattern.

The force by which the vapor deposition mask 1 is magnetically attracted toward the target substrate 5 is proportional to the volume (or thickness) of the magnetic material section 4.

As illustrated in (a) and (c) of FIG. 3, the main line sections 41 each have a thickness which is greater than that of each of the island sections 43. As such, as indicated by the arrows of (a) and (c) of FIG. 3, in the vapor deposition mask 1, a magnetic force applied to regions in which the main line sections 41 are formed is greater than a magnetic force applied to regions in which the island sections 43 are formed.

As illustrated in (a) and (b) of FIG. 3, each portion of the magnetic material section 4 where there are branch sections 42 extending from one of the main line sections 41 has a volume which is greater than that of each portion where there are no branch sections 42 protruding from one of the main line sections 41. As such, as indicated by the arrows of (a) and (b) of FIG. 3, in the vapor deposition mask 1, a magnetic force applied to a region where there are branch sections 42 extending from one of the main line sections 41 is greater than a magnetic force applied to a region where there are no branch sections 42 protruding from one of the main line sections 41. That is, a large magnetic force is applied to a region between mutually diagonally adjacent ones of the apertures 3, thereby making it possible to bring this region into close contact with the target substrate 5 with a strong attractive force.

[Vapor Deposition Device 10]

(a) and (b) of FIG. 4 are each a cross-sectional view of major components of a vapor deposition device 10 employing the vapor deposition mask 1, the views being for describing a vapor deposition shadow in the vapor deposition device 10. Note that (a) of FIG. 4 corresponds to a cross-sectional view taken along line A-A of FIG. 1, and (b) of FIG. 4 corresponds to a cross-sectional view taken along line C-C of FIG. 1. Arrows in (a) and (b) of FIG. 4 indicate paths of vapor deposition particles 9.

The vapor deposition device 10 in accordance with Embodiment 1 includes the vapor deposition mask 1, the magnetic force generating source 6, and a vapor deposition source 7, as illustrated in (a) and (b) of FIG. 4, as well as a vapor deposition source moving device (not shown), a substrate moving device (not shown), and a substrate holder (not shown).

The substrate holder is a member for holding the vapor deposition mask 1, the magnetic force generating source 6, and the target substrate 5. The vapor deposition mask 1 is brought into contact with the target substrate 5 by the magnetic force generating source 6, and in this state, the vapor deposition mask 1 is held, by the substrate holder, along with the magnetic force generating source 6 and the target substrate 5.

The magnetic force generating source 6 is provided on a side of the target substrate 5 which side faces away from the vapor deposition mask 1. That is, the magnetic force generating source 6 is provided on a substrate holder side of the target substrate 5. A magnet or an electromagnet, for example, can be employed as the magnetic force generating source 6.

The vapor deposition source 7 is provided so as to face a side of the vapor deposition mask 1 which side faces away from the target substrate 5. The vapor deposition source 7 can be realized by, for example, a container containing a vapor deposition material therein. Note that the vapor deposition source 7 can be a container directly containing therein a vapor deposition material. Alternatively, the vapor deposition source 7 can include a load-lock pipe so that a vapor deposition material is supplied to the vapor deposition source 7 from an external source.

The vapor deposition source 7 has, for example, a rectangular shape. The vapor deposition source 7 has, on a top surface thereof (that is, on a surface facing the vapor deposition mask 1), a plurality of emission holes 8 (through holes, nozzles) from which vapor deposition particles 9 are emitted. As illustrated in (a) of FIG. 4, the plurality of emission holes 8 are provided at a certain pitch in the X direction (second direction), for example, in a one-dimensional manner (i.e., in a line-like manner).

The vapor deposition source 7 generates vapor deposition particles 9 in the form of a gas by heating a vapor deposition material so that the vapor deposition material is evaporated (in a case where the vapor deposition material is a liquid material) or sublimated (in a case where the vapor deposition material is a solid material). The vapor deposition source 7 emits, from the emission holes 8 and toward the vapor deposition mask 1, the vapor deposition material as vapor deposition particles 9.

In Embodiment 1, an example is described in which the vapor deposition source 7 is realized by a vapor deposition source (line source) having emission holes 8 arranged in a one-dimensional manner (in a line-like manner). Note, however, that the vapor deposition source 7 is not limited to this and may have emission holes 8 which are arranged in a two-dimensional matter (i.e., in a planar (tile) manner).

Next, prior to discussion of a vapor deposition method of the vapor deposition device 10, provided here is a discussion of a vapor deposition shadow occurring with the vapor deposition mask 1, with reference to (a) and (b) of FIG. 4.

[Vapor Deposition Shadow]

As illustrated in (a) and (b) of FIG. 4, in a vapor deposition process, the vapor deposition mask 1 is caused to face the vapor deposition surface of the target substrate 5, and the vapor deposition source 7 is positioned on a side opposite from the target substrate 5 with respect to the vapor deposition mask 1. As such, vapor deposition particles 9 which are emitted from the vapor deposition source 7 over a wide range pass through the apertures 3 of the vapor deposition mask 1 before arriving at the surface of the target substrate 5.

Note here that in a case where the magnetic material section 4 is provided as a structure on the surface of the mask substrate 2, the magnetic material section 4 will block a portion of vapor deposition particles 9 from passing through the apertures 3, specifically, a portion of the vapor deposition particles 9 which is emitted toward the mask substrate 2 at an angle smaller than a specific angle with respect to the surface of the mask substrate 2.

A phenomenon as described above, where a portion of the vapor deposition particles 9 is blocked by a structure on the surface of the vapor deposition mask is generally known as shadowing. This phenomenon can cause (i) a reduction in mass production efficiency due to, for example, (a) a reduction in vapor deposition precision of a fine metal process, (b) a reduction in efficiency of utilization of vapor deposition particles, and (c) limitations on device design, as well as (ii) an increase in costs. A vapor deposition shadow is, therefore, a phenomenon which can cause significant problems and which is, as such, preferably inhibited.

If consideration were given only to enhancing the degree of contact between the target substrate 5 and the vapor deposition mask 1, and the magnetic material section 4 on the main surface 2a of the mask substrate 2 were designed to be thick so as to increase the force of magnetic attraction, then a portion of the vapor deposition particles 9 would be blocked by such a magnetic material section 4 and be prevented from passing through the apertures 3.

For this reason, in order to inhibit a vapor deposition shadow, the magnetic material section 4 is preferably not provided in the vicinity of the apertures 3. Unfortunately, such a configuration would reduce the degree of contact between the target substrate 5 and the vapor deposition mask 1. In other words, enhancement of the degree of contact involves a trade off with inhibition of a vapor deposition shadow, and vice versa.

The vapor deposition mask 1 of Embodiment 1 is configured such that the island sections 43 each have a thickness that which less than that of (i) each of the main line sections 41 and (ii) each of the branch sections 42.

In this way, as illustrated in (a) and (b) of FIG. 4, in Embodiment 1, each of the island sections 43 of the magnetic material section 4, being positioned in line with respective Y aperture lines 31 in a plan view, has a height (that is, a height from the surface of the mask substrate 2) which is less than that of each portion of each of the main line sections 41 of the magnetic material section 4, which portion is positioned in line with respective X aperture lines 32 in a plan view. Further, as can be seen from FIG. 1, (b) of FIG. 2, and (b) of FIG. 3, along the line B-B of FIG. 1, the height of the magnetic material section 4 decreases (i.e., thickness decreases) as proximity to one of the Y aperture lines 31 increases.

As such, by moving the vapor deposition source 7 along the Y aperture lines 31, the island sections 43 being lined up therealong, it is possible for the vapor deposition particles 9 to pass through (enter) the apertures 3 from a very wide range of angles, as illustrated in (b) of FIG. 4. This makes it possible to effectively inhibit shadowing and increase the efficiency of utilization of the vapor deposition particles 9.

That is, as illustrated in (a) and (b) of FIG. 4, in Embodiment 1, vapor deposition particles 9 moving with respect to the Y direction can enter the apertures 3 from a greater angle than vapor deposition particles 9 moving with respect to the X direction. In other words, vapor deposition particles 9 traveling in a YZ plane can enter the apertures 3 from a greater angle than vapor deposition particles 9 travelling in as XZ plane.

As such, a vapor deposition shadow occurring from vapor deposition particles 9 moving with respect to the Y direction is better inhibited than a vapor deposition shadow occurring from vapor deposition particles 9 moving with respect to the X direction.

Note that the above-described form of the magnetic material section 4 is an example, and that the magnetic material section 4 of the present invention is not limited to such. The form of the magnetic material section 4 is not limited, provided that (i) the magnetic material section 4 is formed so as to be interposed between each line of the apertures 3, (ii) a portion of the magnetic material section 4 which is interposed between mutually adjacent ones of the X aperture lines 32 has a first thickness and a second thickness less than the first thickness, the first thickness being that of each portion positioned in an area between mutually adjacent ones of the Y aperture lines 31, second thickness being that of each portion positioned between ones of the apertures 3 which ones are mutually adjacent in a Y aperture line 31.

The thickness of the magnetic material section 4 is preferably designed optimally in accordance with the range of direction of travel of the vapor deposition particles 9. The thickness of the magnetic material section 4 preferably decreases as proximity to one of the apertures 3 increases.

The vapor deposition mask 1 of Embodiment 1 has main line sections 41 each provided in the form a continuous stripe. This enhances the overall strength of the vapor deposition mask 1.

[Vapor Deposition Method]

The following description will discuss a vapor deposition method, in accordance with Embodiment 1, for forming the vapor-deposited film 11 in a matrix pattern on the target substrate 5.

In the vapor deposition method of Embodiment 1, the target substrate 5 and the vapor deposition mask 1 are caused to face each other, and vapor deposition particles 9, emitted from the emission holes 8 of the vapor deposition source 7, pass through the apertures 3 of the vapor deposition mask 1 and are deposited on the surface of the target substrate 5.

In this method, the magnetic force generating source 6 is provided on a back side of the target substrate 5, as illustrated in (a) through (c) of FIG. 3. The magnetic force generating source 6 attracts the vapor deposition mask 1 and causes the target substrate 5 and the vapor deposition mask 1 to be in contact with each other. Magnetic force from the magnetic force generating source 6 pulls the magnetic material section 4 toward the magnetic force generating source 6 and therefore causes the target substrate 5 and the vapor deposition mask 1 to be in close contact with each other.

The vapor deposition source 7 is realized by a line source having a plurality of emission holes, along the X direction, for emitting vapor deposition particles 9. While the target substrate 5 and the vapor deposition mask 1 are in contact (close contact) with each other, the vapor deposition source 7 carries out vapor deposition as at least one from the group consisting of (i) the target substrate 5, being in contact (fixed contact) with the vapor deposition mask 1 and (ii) the line source is moved in the Y direction.

With Embodiment 1, the magnetic material section 4 is provided so as to be interposed between each of the apertures 3. This makes it possible to (i) prevent portions of the vapor deposition mask 1 which surround each of the apertures 3 from being separated from the target substrate 5 and (ii) reliably secure close contact between the target substrate 5 and the vapor deposition mask 1. As such, Embodiment 1 makes it possible to carry out vapor deposition while the target substrate 5 and the vapor deposition mask 1 are in close contact with each other, particularly while portions of the vapor deposition mask 1 around each of the apertures 3 are in close contact with the target substrate 5, as described above. Embodiment 1 therefore makes it possible to increase the precision of the vapor deposition pattern.

Furthermore, as described above, a portion of the magnetic material section 4, which portion is in a region between mutually adjacent ones of the X aperture line 32 has a first thickness and a second thickness which is less than that of the first thickness. Here, the first thickness refers to that of the branch sections 42 and portions of the main line sections 41 which (i) constitute one of the magnetic material lines 44 between mutually adjacent ones of the Y aperture lines 31 and (b) more specifically, constitute one of the regions 46. The second thickness refers to that of each of the island sections 43, which are positioned between ones of the apertures 3 which ones are mutually adjacent in one of the Y aperture lines 31. With this configuration, vapor deposition particles 9 travelling with respect to the Y direction can enter the apertures 3 from a greater of angle than vapor deposition particles 9 travelling with respect to the X direction.

As such, by causing the line source to move in the Y direction, it is possible to cause the vapor deposition particles 9 to enter the apertures 3 as the line source moves over a wide range. This makes it possible to increase the efficiency of utilization of the vapor deposition particles 9. As a result, it becomes possible to increase mass production efficiency.

In this way, in Embodiment 1, vapor deposition particles 9 are deposited on the target substrate 5 while (i) the vapor deposition mask 1 and the target substrate 5 are brought into close contact via magnetic force and (ii) the vapor deposition source 7 moves in the Y direction. This makes it possible to produce a vapor-deposited film 11 having a vapor-deposited film pattern in the form of a matrix, in which vapor-deposited film 11 the occurrence of a vapor deposition shadow is inhibited.

The vapor deposition method in accordance with Embodiment 1 can be used to form, for example, a luminescent layer as the vapor-deposited film 11 on the target substrate 5. The method can therefore be used as a method of producing an EL display device, such as an organic EL display device or inorganic EL display device, which has a luminescent layer in a matrix arrangement.

The vapor deposition device 10 in accordance with Embodiment 1 can be used as a device for producing an EL display device, such as an organic EL display device or an inorganic EL display device, which has a luminescent layer in a matrix arrangement.

The vapor deposition device 10 in accordance with Embodiment 1 can employ a magnetic force generating source, such as a magnet or electromagnet, on a substrate holder side of the target substrate 5, as done in a conventional magnet-type configuration. As such, there is no need to provide new structures in the vapor deposition device 10, thereby enabling a reduction in cost and, in turn, an increase in productivity.

[Method of Producing Vapor Deposition Mask 1]

Next, the following description will discuss a method of producing the vapor deposition mask 1 of Embodiment 1, with reference to (a) through (e) of FIG. 5 and (a) and (b) of FIG. 6.

The following description discusses an example in which resin is used as the material of the mask substrate 2 and invar is used as the material of the magnetic material section 4. Note, however, that Embodiment 1 is not limited to this example.

(a) through (e) of FIG. 5 are plan views illustrating the order of steps for producing a vapor deposition mask.

In production of the vapor deposition mask 1, first, a laminated body is prepared. The laminated body is obtained by laminating together (i) a magnetic material film 40 and (ii) the mask substrate 2 (specifically, a film (nonmagnetic material film) made from a non-metal material such as resin or a ceramic material and used as the mask substrate 2).

Note that a method for laminating (i) the film used as the mask substrate 2 and (ii) the magnetic material film 40 is not particularly limited. The lamination method can be, for example, a method in which the magnetic material film 40 is in the form of a metal foil and is bonded to a surface of a film (mask substrate 2) made from a non-metal material by, for example, forming the film made from the non-metal material on the magnetic material film 40. Specifically, for example, a resin such as polyimide can be applied to the entirety of a surface of an invar film having a thickness of 40 μm, which invar film serves as the magnetic material film. In this way, a laminated body including (i) the magnetic material film 40 made from invar and (ii) the mask substrate 2 made from a polyimide film is prepared.

Alternatively, the lamination method can be a method in which, for example, the magnetic material film 40 is bonded to the entirety of a surface of the mask substrate 2 by forming the magnetic material film 40 on the mask substrate 2 (i.e., on the main surface 2a of the mask substrate 2), the mask substrate 2 being made from a ceramic material or the like. Specifically, a sputtering method or the like can be used to form the magnetic material film 40 on a ceramic body made from, for example $Al_2O_3$ or Si.

Discussed here is an example in which the former lamination method is employed.

Next, as illustrated in (a) of FIG. 5, a resist 80 is laminated onto the magnetic material film 40, the magnetic material film 40 being laminated onto the mask substrate 2. This is done by, for example, applying the resist 80 to the magnetic material film 40.

Thereafter, as illustrated in (b) of FIG. 5, a normal photolithography process is used to pattern the resist 80. During the patterning, the resist 80 is caused to have a substantially grid-like pattern. This substantially grid-like pattern includes narrow portions in which line width differs in the X direction.

More specifically, the resist 80 is patterned so as to include (i) main line resist sections 81 (resist main line sections) having a pattern of main lines, each in the form of a stripe extending in the Y direction, (ii) branch resist sections 82 (resist branch sections) having a pattern of branches which extend, in parallel with the X direction, from both sides of each of the main line resist sections 81, and (iii) island resist sections 83 (resist island sections) having a pattern of islands, each of which is formed between ones of the branch resist sections 82 which ones extend toward each other.

Next, as illustrated in (c) of FIG. 5, a normal metal wet etching process is used to remove portions of the magnetic material film 40 which are not covered by the resist 80 which has been patterned. The magnetic material section 4, which is constituted by portions of the magnetic material film 40 which are sandwiched between the resist 80 and the mask substrate 2, is not removed by the etching, and remains under the resist 80. The regions shown by dotted lines in FIG. 5 indicate the contours of the magnetic material section 4 remaining under the resist 80.

Next, the resist 80 is removed, as illustrated in (d) of FIG. 5. Thus, in correspondence with (i) the main line resist sections 81, (ii) the branch resist sections 82, and (iii) the island resist sections 83, the magnetic material section 4 is formed from the magnetic material film 40 so as to include (iv) the main line sections 41 in a pattern extending in the Y direction, and (v) the branch sections 42 and the island sections 43 in a pattern extending in the X direction (in an arrangement extending in the X direction). Note that the resist 80 can be removed by use of, for example, a known resist-removing liquid.

Subsequently, as illustrated in (e) of FIG. 5, the apertures 3 are each formed in the mask substrate 2 in a respective region surrounded by the main line sections 41, the branch sections 42, and the island sections 43. The apertures 3 can be formed by use of, for example, a normal etching process, a laser method, or a physical method using a drill, a punch, or the like.

Thus, the vapor deposition mask 1 can be produced via the above process. Note, however, that production of the vapor deposition mask 1 is not limited to the above. Another production process can be employed, provided that the process allows for production of the vapor deposition mask 1 having the above-described structure.

(a) of FIG. 6 is a cross-sectional view taken along the line D-D of (c) of FIG. 5, and (b) of FIG. 6 is a cross-sectional view taken along the line E-E of (c) of FIG. 5.

As described above, unnecessary portions of the magnetic material film 40 are removed via wet etching. As such, due to the effects of side etching (undercutting), the main line sections 41 each have a width which is less than that of each of the main line resist sections 81, as illustrated in (a) of FIG. 6.

Because etching of the magnetic material film 40 progresses from a resist 80 side, exposure to an etching liquid occurs sooner for a portion of the magnetic material film 40 which is toward the resist 80 side (a lower surface side of the magnetic material film 40 as seen in (a) of FIG. 6). This causes an end of each of the main line sections 41, which end contacts a respective main line resist section 81, to have a smaller diameter than that of an end which contacts the mask substrate 2.

Furthermore, as shown in (c) of FIG. 5, the branch resist sections 82 each have a Y direction-wise width which is less than an X direction-wise width of each of the main line resist sections 81. In portions of the magnetic material film 40 beneath the branch resist sections 82, etching progresses from both Y direction-wise ends of the branch resist sections 82. As a result, portions of the branch sections 42 which are more toward the resist 80 are etched away, and the branch sections 42 therefore each have a thickness which is less than that of each of the main line sections 41, as illustrated in (b) of FIG. 6.

In portions of the magnetic material film 40 beneath the island resist sections 83 of the resist 80, etching progresses from the entire perimeter of the island resist sections 83. As a result, the island sections 43 each have a thickness which is less than that of each of the branch sections 42 and each of the main line sections 41, as illustrated in (b) of FIG. 6. During the etching, since the island resist sections 83 of the resist 80 lose contact with the magnetic material film 40 (i.e., the magnetic material section 4), the island resist sections 83 come off and are removed.

The vapor deposition device can employ a magnetic force generating source, such as a magnet or electromagnet, on the substrate holder side of the target substrate 5, as in a conventional magnet-type configuration. As such, there is no need to provide new structures in the vapor deposition device, thereby enabling a reduction in cost and, in turn, an increase in productivity.

The following description will discuss a variation of Embodiment 1.

[Variation 1]

In Embodiment 1, an example was discussed in which the main line sections 41 and the branch sections 42 constitute protruding sections having a stepped cross section. Note, however, that Embodiment 1 is not limited to this. The protruding sections can alternatively have a shape (a chevron shape) in which the thickness thereof gradually changes toward the center of a respective one of the main line sections 41.

The following description will discuss Embodiment 2 of the present invention, with reference to FIGS. 7 through 9. Note that in Embodiment 2, points which differ from Embodiment 1 are discussed. Members having functions identical to those of the respective members described in Embodiment 1 are given respective identical reference numerals, and a description of those members is omitted here. Furthermore, it is of course possible to alter Embodiment 2 in a manner similar to Embodiment 1.

[Main Configuration of Vapor Deposition Mask 1]

FIG. 7 is a plan view which schematically illustrates (i) a configuration of a vapor deposition mask 1 in accordance with Embodiment 2 of the present invention and (ii) a vapor-deposited film 11 formed by using the vapor deposition mask 1.

As illustrated in FIG. 7, the vapor deposition mask 1 in accordance with Embodiment 2 is the same as that of Embodiment 1, with the exception that the main line sections 41 of the former include recessed portions 47.

The recessed portions 47 are each provided in a region of a respective one of the main line sections 41 which region is opposite one of the apertures 3. Specifically, the recessed portions 47 are each provided in a portion of a respective one of the main line sections 41 which portion is positioned between ones of the apertures 3 which ones are mutually adjacent in an X aperture line 32. Note that the recessed portions 47 each have a Y direction-wise width which is approximately equal to the Y direction-wise width of each of the apertures 3.

(a) through (e) of FIG. 8 are each a cross-sectional view which schematically illustrates (i) a configuration of the vapor deposition mask 1 in accordance with Embodiment 2 and a vapor-deposited film 11 formed by using the vapor deposition mask 1. (a) of FIG. 8 is a cross-sectional view taken along the line F-F of FIG. 7; (b) of FIG. 8 is a cross-sectional view taken along the line G-G of FIG. 7; (c) of FIG. 8 is a cross-sectional view taken along the line H-H of FIG. 7; (d) of FIG. 8 is a cross-sectional view taken along the line I-I of FIG. 7; and (e) of FIG. 8 is a cross-sectional view taken along the line J-J of FIG. 7. The dotted lines in (c) and (e) of FIG. 8 indicate the positions of the apertures 3, which are located in a depth-wise direction of the diagram.

FIG. 9 is a cross-sectional view of major components of the vapor deposition device 10, the view being for describing a vapor deposition shadow occurring with the vapor deposition mask 1 in accordance with Embodiment 2. Note that FIG. 9 is a cross-sectional view of major components of the vapor deposition device 10 which view corresponds to a cross-sectional view taken along the line F-F of the vapor deposition mask 1 of FIG. 7. Depictions of the target substrate 5 and the magnetic force generating source 6 have been omitted in FIG. 9. Note that arrows in FIG. 9 indicate paths of vapor deposition particles 9.

As illustrated in (a), (b), and (e) of FIG. 8 the recessed portions 47 of the main line sections 41 each have a thickness (thickness of recessed portion bottom part 47a) that is less than that of other portions (protruding portions 48) of the main line sections 41. Thus, the magnetic material section 4 is configured such that the main line sections 41 (a second portion of the magnetic material 4) each have a first thickness and a second thickness which is less than the first thickness. The first thickness is that of each portion positioned in an area between mutually adjacent ones of the X aperture lines 32 (i.e., that of the protruding portions 48). The second thickness is that of each of the recessed portions 47, which are positioned between ones of the apertures 3 which ones are mutually adjacent in the X direction, (i.e., that of each recessed portion bottom part 47a).

With this configuration, it is possible, as illustrated in FIG. 9, for vapor deposition particles 9 travelling through the recessed portions 47, from the X direction and toward the apertures 3, to enter the apertures 3 from a greater angle than those which do not pass through the recessed portions 47.

Furthermore, since the recessed portions 47 of the main line sections 41 are thinner than other portions (protruding portions 48) of the main line sections 41, the recessed portions 47 have a thickness which is also less than that of portions of the magnetic material section 4 which are both (i) interposed between mutually adjacent ones of the Y aperture lines 31 and (ii) positioned between mutually diagonally adjacent ones of the apertures 3 (i.e., less than that of the protruding portions 48).

As such, it is possible for vapor deposition particles 9 travelling with respect to the X direction (i.e., vapor deposition particles 9 which travel toward the apertures 3 from the X direction) to enter the apertures 3 from a greater angle than those travelling diagonally.

Embodiment 2 therefore inhibits not only (i) a vapor deposition shadow originating from vapor deposition particles 9 travelling toward the apertures 3 from the Y direction, but also (ii) a vapor deposition shadow originating from vapor deposition particles 9 travelling toward the apertures 3 from an X direction. This further makes it possible to inhibit (i) a reduction in mass production efficiency due to, for example, (a) a reduction in vapor deposition precision, (b) a reduction in efficiency of utilization of vapor deposition particles, and (c) limitations on device design, as well as (ii) an increase in costs.

Note that the thickness of the recessed portions 47 can be the same as or different from that of the branch sections 42 or that of the island sections 43, provided that the recessed portions 47 of the main line sections 41 each have a thickness which is less than that of other portions (protruding portions 48) of the main line sections 41. That is, provided that the recessed portions 47 are formed so as to be thinner than the protruding portions 48, the recessed portions 47 can have a thickness that is (i) greater than that of the branch sections 42, (ii) identical to that of the branch sections 42, (iii) less than that of the branch sections 42 but greater than that of the island sections 43, (iv) identical to that of the island sections 43, or (v) less than that of the island sections 43.

As such, in Embodiment 2, a portion of the magnetic material section 4, which portion is formed in a region between mutually adjacent ones of the X aperture lines 32, has a thickness which decreases as proximity to the apertures 3 increases, and, similarly, a portion of the magnetic material section 4, which portion is formed in a region between mutually adjacent ones of the Y aperture lines 31, has a thickness which decreases as proximity to the apertures 3 increases.

[Method of Producing Vapor Deposition Mask 1]

The vapor deposition mask 1 of Embodiment 2 can be produced by, for example, using etching similar to that used in the method of producing the vapor deposition mask 1 in Embodiment 1.

With Embodiment 2, the recessed portions 47 can be formed in the main line sections 41 of the magnetic material film 40 by, for example, during wet etching of the main line sections 41, (i) removing portions of the resist 80 located in a position where the recessed portions 47 are to be formed (i.e., removing regions of the main line resist sections 81 of the resist 80 in which region the recessed portions 47 are to be formed), and (ii) subsequently carrying out half etching of the magnetic material film 40.

Furthermore, in comparison to the main line sections 41 of the vapor deposition mask 1 of Embodiment 1, each of the main line sections 41 of the vapor deposition mask 1 in accordance with Embodiment 2 is not configured to be thinner in its entirety, but is rather configured so that only a portion of each of the main line sections 41 which affects the vapor deposition shadow is thinner.

That is, in each of the main line sections 41 of Embodiment 2, a portion thereof from which branch sections 42 extend has a thickness that is similar to that of each of the main line sections 41 of the vapor deposition mask of Embodiment 1. As such, Embodiment 2 makes it possible to inhibit the occurrence of a vapor deposition shadow while also maintaining a degree of contact with the target substrate 5, which is not reduced when compared to the degree of contact seen with the vapor deposition mask 1 of Embodiment 1.

The following description will discuss Embodiment 3 of the present invention, with reference to FIG. 10 and (a) through (c) of FIG. 11. Note that in Embodiment 3 as well, points which differ from Embodiment 1 are discussed. Members having functions identical to those of the respective members described in Embodiment 1 are given respective identical reference numerals, and a description of those members is omitted here. Furthermore, it is of course possible to alter Embodiment 3 in a manner similar to Embodiments 1 and 2.

[Main Configuration of Vapor Deposition Mask 1]

FIG. 10 is a plan view which schematically illustrates (i) a configuration of a vapor deposition mask 1 in accordance with Embodiment 3 of the present invention and (ii) a vapor-deposited film 11 formed by using the vapor deposition mask 1.

(a) through (c) of FIG. 11 are each a cross-sectional view of major components of the vapor deposition device 10, the view being for describing a vapor deposition shadow occurring with the vapor deposition mask 1 in accordance with Embodiment 3. (a) of FIG. 11 corresponds to a cross-sectional view taken along the line K-K of the vapor deposition mask 1 of FIG. 10; (b) of FIG. 11 corresponds to a cross-sectional view taken along the line L-L of the vapor deposition mask 1 of FIG. 10; and (c) of FIG. 11 is a cross-sectional view taken along the line M-M of the vapor deposition mask 1 of FIG. 10. Note that depictions of the target substrate 5 and the magnetic force generating source 6 have been omitted in (a) through (c) of FIG. 11. Arrows in (a) through (c) of FIG. 11 indicate paths of vapor deposition particles 9.

As illustrated in FIG. 10, the vapor deposition mask 1 of Embodiment 3 includes, as a magnetic material section 4, (i) a thin film 245 (first magnetic material film) constituting a magnetic material mask section and (ii) thick film sections 246 (second magnetic material film) which are protrusions formed on the thin film 245. The magnetic material section 4 is provided on a mask substrate 2 of the vapor deposition mask 1 (that is, on a main surface 2a of the mask substrate 2).

The thin film 245 is formed in a region excluding (i) the apertures 3 and (ii) areas surrounding the apertures 3. The thin film 245 is formed so as to surround each of the apertures 3 while being distanced from each of the apertures 3. The thick film sections 246 are each formed on the thin film 245 in an area between mutually diagonally adjacent ones of the apertures 3 (an area outward from the four corners of each of the apertures 3).

Thus, the magnetic material section 4 is formed so as to be (i) interposed between the Y aperture lines 31 and (ii) interposed between the X aperture lines 32. Furthermore, a portion of the magnetic material section 4, which portion is interposed between the X aperture line 32 (that is, a portion 261 of the magnetic material section 4 between X aperture lines), has a first thickness and a second thickness which is less than the first thickness. The first thickness is that of each of thick film section formation regions 271, which are positioned between mutually adjacent ones of the Y aperture line 31. The second thickness is that of each portion (that is, each region 262) which is positioned between ones of the apertures 3 which ones are mutually adjacent in the Y direction.

Furthermore, a portion of the magnetic material section 4 which portion is interposed between Y aperture lines 31 (that is, portion 251 of the magnetic material section 4 between Y aperture lines) has a first thickness and a second thickness which is less than the first thickness. The first thickness is that of each of the thick film section formation regions 271, which are positioned between mutually adjacent ones of the X aperture lines 32. The second thickness is that of each portion (that is, each region 252), which is positioned between ones of the apertures 3 which ones are mutually adjacent in the X direction.

As such, in the magnetic material section 4, each of the thick film section formation regions 271, which are between mutually diagonally adjacent ones of the apertures 3, has a thickness which is greater than that of (i) each region 262, of the magnetic material section 4, which is formed between ones of the apertures 3 which ones are mutually adjacent in the X direction or (ii) each region 252, of the magnetic material section 4, which is formed between ones of the apertures 3 which ones are mutually adjacent in the Y direction. Put in another way, in the magnetic material section 4, each of the thick film section formation regions 271, which are between mutually diagonally adjacent ones of the apertures 3, has a thickness which is greater than that of (i) each region 262, of the magnetic material section 4, which is formed between ones of the apertures 3 which ones are mutually adjacent in the X direction and (ii) each region 252, of the magnetic material section 4, which is formed between ones of the apertures 3 which ones are mutually adjacent in the Y direction.

As such, a portion (that is, a portion 261 between X aperture lines) of the magnetic material section 4, which portion is formed in a region between mutually adjacent ones of the X aperture lines 32, has a thickness which decreases as proximity to the apertures 3 increases, and, similarly, a portion (that is, the portion 251 between Y aperture lines) of the magnetic material section 4, which portion is formed in a region between mutually adjacent ones of the Y aperture lines 31, has a thickness which decreases as proximity to the apertures 3 increases.

As such, in Embodiment 3 as well, it is possible for vapor deposition particles 9 travelling toward the apertures 3 from the X direction to enter the apertures 3 from a greater angle than those travelling diagonally.

Embodiment 3 therefore inhibits a vapor deposition shadow originating from vapor deposition particles 9 travelling toward the apertures 3 from the X direction and the Y direction and, consequently, makes it possible to inhibit (i) a reduction in mass production efficiency due to, for example, (a) a reduction in vapor deposition precision, (b) a reduction in efficiency of utilization of vapor deposition particles, and (c) limitations on device design, as well as (ii) an increase in costs.

Note that in Embodiment 3, the thick film sections 246 are each formed to be thicker than the thin film 245, as illustrated in (a) through (c) of FIG. 11. Each of the thick film sections 246 can have a thickness which is greater than that of each of the main line sections 41 of the respective magnetic material sections 4 of Embodiments 1 and 2.

The force by which the vapor deposition mask 1 is magnetically attracted toward the target substrate 5 is proportional to the volume (or thickness) of the magnetic material section 4. As such, by providing each of the thick film sections 246, constituted by a magnetic material, in a respective portion of the magnetic material section 4 between mutually diagonally adjacent ones of the apertures 3, it is possible to increase the thickness of the magnetic material section 4 in that portion and, consequently, increase the degree of contact between the vapor deposition mask 1 and the target substrate 5.

In a case where a line source is used as the vapor deposition source 7 of a vapor deposition device for mass production, a portion of the magnetic material section 4 between apertures 3 which are mutually adjacent in the X or Y direction can be more likely to cause a vapor deposition shadow, in comparison to a portion of the magnetic material section 4 between apertures 3 which are mutually diagonally adjacent. Put in another way, even in a case where the portion of the magnetic material section 4 between apertures 3 which are mutually diagonally adjacent is configured to have an increased thickness, that portion is unlikely to cause a vapor deposition shadow.

The vapor deposition mask 1 of Embodiment 3 includes the thin film 245, which is constituted by a magnetic material and is provided in a region excluding (i) the apertures 3 and (ii) areas surrounding the apertures 3. Furthermore, the vapor deposition mask 1 includes the thick film sections 246, each of which is constituted by a magnetic material and is provided, on the thin film 245, in a respective region between mutually diagonally adjacent ones of the apertures 3.

With this configuration, Embodiment 3 makes it possible to minimize the occurrence of a vapor deposition shadow while also increasing the degree of contact between the vapor deposition mask 1 and the target substrate 5.

Furthermore, in Embodiment 3, the thin film 245 is provided, as the magnetic material section 4, so as to substantially cover the entire surface of the mask substrate 2, excepting the apertures 3. As such, with the vapor deposition mask 1 of Embodiment 3, providing the magnetic force generating source 6 opposite the vapor deposition mask 1 with respect to the target substrate 5, causes a magnetic force of attraction to act on the entirety of the vapor deposition mask 1. This makes it possible to increase the degree of contact between the vapor deposition mask 1 and the target substrate 5 even more than in Embodiments 1 and 2.

[Method of Producing Vapor Deposition Mask 1]

The vapor deposition mask 1 of Embodiment 3 can be produced by, for example, using etching similar to that used in the method of producing the vapor deposition mask 1 in Embodiment 1.

In producing the vapor deposition mask 1, a laminated body can be prepared by (i) applying, via a sputtering method, a thin coating of a magnetic metal such as nickel onto a sheet made from a magnetic material such as invar, which sheet will become a thick magnetic body and (ii) applying a resin such as polyimide onto the thin coating. The laminated body formed thusly includes, on the mask substrate 2, (a) a first magnetic material film (thin film 245) and (b) a second magnetic material film, from which the thick film sections 246 are to be formed, which second magnetic material film is thicker than the first magnetic material film, the first and second magnetic material films being provided in this order.

In Embodiment 3, the vapor deposition mask 1 can be produced by (i) utilizing a resist (not shown) to carrying out wet etching of the second magnetic material film of the laminated body, such that the second magnetic material film has a matrix pattern in which a plurality of the thick film sections 246, formed from the second magnetic material film, are lined up in an non-continuous manner in the X and Y directions and (ii) thereafter, forming the apertures 3 such that each of the thick film sections 246 falls along a line passing diagonally through one of the apertures 3.

Note that the first magnetic material film (thin film 245) can be provided on the entirety of the mask substrate 2, excepting regions where the apertures 3 are provided. However, in order to inhibit a vapor deposition shadow, the magnetic material section 4 is preferably not provided in areas surrounding the apertures 3. As such, portions of the first magnetic material film (thin film 245) which surround the apertures 3 are preferably removed via etching after the apertures 3 are formed. Removal of the first magnetic material film (thin film 245) can be carried out via wet etching which uses a resist (not shown).

[Recap]

A vapor deposition mask 1 in accordance with Aspect 1 of the present invention is a vapor deposition mask for forming a vapor-deposited film 11, in a matrix, on a target substrate 5, the vapor deposition mask 1 including: a mask substrate 2; and a magnetic material section 4 provided on a first main surface (main surface 2a) of the mask substrate 2, the mask substrate 2 including a plurality of apertures 3 constituting (i) first aperture lines (Y aperture lines 31), each constituted by ones of the plurality of apertures 3 which ones are lined up in a first direction (Y direction) and (ii) second aperture lines (X aperture lines 32), each constituted by ones of the plurality of apertures 3 which ones are lined up in a second direction (X direction) orthogonal to the first direction, the magnetic material section 4 being provided so as to be (iii) interposed between the first aperture lines (Y aperture lines 31) and (iv) interposed between the second aperture lines (X aperture lines 32), a first portion (magnetic material lines 44, portion 261 between X aperture lines) of the magnetic material 4, which first portion is interposed between the second aperture lines, having a first thickness and a second thickness which is less than the first thickness, the first thickness of the first portion being that of each sub-portion (linear pattern sections 45, thick film section formation regions 271) thereof which is positioned between mutually adjacent ones of the first aperture lines, the second thickness of the first portion being that of each sub-portion (island sections 43, regions 262) thereof which is positioned between ones of the plurality of apertures 3 which ones are mutually adjacent in the first direction.

With the above configuration, the vapor deposition mask 1 includes a magnetic material section 4 which is interposed between each of the aperture lines (that is, between each of the apertures). This configuration makes it possible, even in a case where the mask substrate 2 is made from a non-magnetic material which is a non-metal material, to magnetically attract the magnetic material section 4. This makes it possible to (i) prevent the vapor deposition mask from separating from an area surround each of the apertures 3 and (ii) reliably secure close contact between the target substrate 5 and the vapor deposition mask 1.

As such, the above configuration makes it possible to carry out vapor deposition while the target substrate 5 and the vapor deposition mask 1 are in close contact with each other, particularly while portions of the vapor deposition mask 1 around each of the apertures 3 are in close contact with the target substrate 5, as described above.

In a case where (i) the magnetic material section 4 on the surface of the mask substrate 2 is made to be thick and have a certain height in order to increase the force of magnetic attraction, and (ii) a vapor deposition particle 9 is emitted toward the mask substrate 2 from an angle, with respect to the surface of the mask substrate 2, which is less than a certain angle, that vapor deposition particle 9 will be blocked by the magnetic material section 4. In such a case, forming the magnetic material section 4 on the mask substrate 2 would decrease the angle from which the vapor deposition particles 9 could enter the apertures 3 and, as a result, reduce the efficiency of utilization of the vapor deposition particles 9.

With the above configuration, however, a portion of the magnetic material section 4, which portion is interposed between the second aperture lines, has a first thickness and a second thickness which is less than the first thickness, the first thickness being that of each sub-portion thereof which is positioned between mutually adjacent ones of the first aperture lines, the second thickness being that of each sub-portion thereof which is positioned between ones of the plurality of apertures 3 which ones are mutually adjacent in the first direction. That is, each portion of the magnetic material section 4 which portion is interposed between the second aperture lines has a cyclically repeating protruding shape in which each sub-portion, between ones of the plurality of apertures 3 which ones are mutually adjacent in first direction, has a thickness which is less than at least that of each sub-portion between mutually diagonally adjacent ones of the plurality of apertures 3. This makes it possible for vapor deposition particles 9 travelling with respect to the first direction to enter the apertures 3 from a greater angle than vapor deposition particles 9 travelling diagonally.

As such, the above configuration makes it possible to provide a vapor deposition mask 1 which makes it possible to (i) inhibit a reduction in the efficiency of utilization of vapor deposition particles 9 travelling with respect to the first direction, (ii) increase the degree of contact between the vapor deposition mask and the target substrate 5, and (iii) increase the precision of the vapor deposition pattern.

In Aspect 2 of the present invention, the vapor deposition mask 1 in accordance with Aspect 1 can be configured such that a second portion (main line sections 41, portion 251 between Y aperture lines) of the magnetic material section, which second portion is interposed between the first aperture lines (Y aperture lines 31), has a first thickness and a second thickness which is less than the first thickness of the second portion, the first thickness of the second portion being that of each sub-portion (protruding portions 48, thick film section formation regions 271) thereof which is positioned between mutually adjacent ones of the second aperture lines, the second thickness of the second portion being that of each sub-portion (recessed portions 47, regions 252) thereof which is positioned between ones of the plurality of apertures 3 which ones are mutually adjacent in the second direction.

With the above configuration, a portion of the magnetic material section 4 which is interposed between the first aperture lines has a first thickness and a second thickness which is less than the first thickness, the first thickness being that of each sub-portion thereof which is positioned between mutually adjacent ones of the second aperture lines, the second thickness being that of each sub-portion thereof which is between ones of the plurality of apertures 3 which ones are mutually adjacent in the second direction. That is, each portion of the magnetic material section 4, which portion is in a region between ones of the plurality of apertures 3 which ones are mutually adjacent in the second direction, has a thickness that is less than that of each portion of the magnetic material section 4 which portion is in a region between mutually diagonally adjacent ones of the plurality of apertures 3.

This makes it possible for vapor deposition particles 9, travelling with respect to the second direction, to enter the apertures 3 from a greater angle than vapor deposition particles 9 travelling diagonally.

As such, the above configuration makes it possible to (i) inhibit a reduction in the efficiency of utilization of vapor deposition particles 9 travelling with respect to the second direction and (ii) increase the degree of contact between the vapor deposition mask 1 and the target substrate 5.

In Aspect 3 of the present invention, the vapor deposition mask 1 in accordance with Aspect 1 or 2 can be configured such that: the plurality of apertures 3 are provided in a matrix; and each portion (island sections 43, recessed portions 47, region 252, region 262), of the magnetic material section 4, which is positioned between ones of the plurality of apertures 3 which ones are mutually adjacent in the first direction or the second direction has a thickness which is less than that of each portion (magnetic material lines 44, region 46, protruding portions 48, thick film section formation regions 271), of the magnetic material section 4, which is positioned between mutually diagonally adjacent ones of the plurality of apertures 3.

This makes it possible for vapor deposition particles 9, travelling with respect to the first and second directions, to enter the apertures 3 from a greater angle than vapor deposition particles 9 travelling diagonally.

As such, the above configuration makes it possible to (i) inhibit a reduction in the efficiency of utilization of vapor deposition particles 9 travelling with respect to the first and second directions and (ii) increase the degree of contact between the vapor deposition mask 1 and the target substrate 5.

In Aspect 4 of the present invention, the vapor deposition mask 1 in accordance with in any one of Aspects 1 through 3 can be configured such that the magnetic material section 4 includes: main line sections 41, each of which is provided so as to be (i) positioned between the first aperture lines (Y aperture lines 31) and (ii) in the form of a stripe extending in the first direction; branch sections 42 which extend, in parallel with the second direction, from each side of each of the main line sections 41; and island sections 43, each of which is provided so as to be (i) between ones of the branch sections 42 which ones extend toward each other, (ii) separate from the main line sections 41 and the branch sections 42, and (iii) in a respective area, between mutually adjacent ones of the second aperture lines (X aperture lines 32), where one of the first aperture lines intersects with the second aperture lines, the island sections 43 each having a thickness which is less than (i) that of each portion, of each of the main line sections 41, which portion is between mutually adjacent ones of second aperture lines and (ii) that of each of the branch sections 42 between mutually adjacent ones of the second aperture lines.

The above configuration makes it possible to achieve a magnetic material section 4 which is (i) interposed between each of the apertures 3 and (ii) configured such that a portion of the magnetic material section 4, which portion is between mutually adjacent ones of the second aperture line, has a first thickness and a second thickness which is less than the first thickness, the first thickness being that of each sub-portion thereof where there is no intersection with one of the first aperture lines, the second thickness being that of each sub-portion thereof where there is an intersection with one of the first aperture lines.

Furthermore, in the above configuration, main line sections 41 are each provided in the form of a continuous stripe. This makes it possible to enhance the overall strength of the vapor deposition mask 1.

In Aspect 5 of the present invention, the vapor deposition mask 1 as set forth in Aspect 4 can be configured such that each of the branch sections 42 between mutually adjacent ones of second aperture lines has a thickness that is less than that of each of the main line sections 41.

With the above configuration, each portion of the magnetic material section 4, which portion is between the second aperture lines, has a thickness that decreases as proximity to one of the apertures 3 of one of the first aperture lines increases.

As such, the above configuration makes it possible to increase an angle from which vapor deposition particles 9, travelling with respect to the first direction, can enter the aperture 3, and therefore makes it possible to allow the vapor deposition particles 9 to pass through the apertures 3 from a very wide range of angles. This makes it possible to (i) effectively inhibit the occurrence of shadowing and (ii) increase the efficiency of utilization of the vapor deposition particles 9.

In Aspect 6 of the present invention, the vapor deposition mask 1 in accordance with any one of Aspects 1 through 3 can be configured such that the magnetic material section 4 includes: a first magnetic material film (thin film 245) laminated onto a portion of the mask substrate 2 which portion excludes the plurality of apertures 3; and a second magnetic material film (thick film sections 246) provided on a portion (thick film section formation regions 271) of the first magnetic material film which portion is positioned between mutually diagonally adjacent ones of the plurality of apertures 3.

In the above configuration, the first magnetic material film is provided by laminating a film made from a magnetic material onto a region of the mask substrate 2 which region excludes the plurality of apertures 3. This makes it possible to magnetically attract the entirety of the vapor deposition mask 1. As such, the above configuration makes it possible to increase the degree of contact between the vapor deposition mask 1 and the target substrate 5.

In Aspect 7 of the present invention, the vapor deposition mask 1 in accordance with any one of Aspects 1 through 6 can be configured such that the mask substrate 2 is made from at least one material selected from a group consisting of resin and a ceramic material.

A mask substrate made from a nonmagnetic material allows for apertures to be made with high precision. In particular, resin and ceramic materials can be easily processed by, for example, laser processing, and thus a mask substrate made from at least one material selected from the group consisting of resin and ceramic materials allows for apertures to be made with high precision. As such, the above configuration makes it possible to increase (i) the precision of positioning of the apertures 3 in the mask substrate 2 and (ii) the precision of a vapor deposition pattern.

The above configuration allows for vapor deposition to be carried out while the vapor deposition mask 1, having high-precision apertures, is in close contact with the target substrate 5. This makes it possible to effectively utilize the potential of the apertures 3 formed with high precision. The above configuration therefore makes it possible to increase the precision of a vapor deposition pattern.

In Aspect 8 of the present invention, the vapor deposition mask 1 in accordance with Aspect 7 can be configured such that the resin includes at least one selected from a group consisting of polyimide, polyethylene, polyethylene naphthalate, polyethylene terephthalate, and epoxy resin.

The above configuration makes it possible to form the apertures 3 with high precision, in the mask substrate 2, by use of laser processing. As such, the above configuration makes it possible to increase (i) the precision of positioning of the apertures 3 in the mask substrate 2 and (ii) the precision of a vapor deposition pattern.

A vapor deposition device 10 in accordance with Aspect 9 of the present invention includes: a vapor deposition mask 1 in accordance with any one of Aspects 1 through 8; a magnetic force generating source 6 provided opposite from the vapor deposition mask 1 with respect to the target substrate 5, the magnetic force generating source 6 causing the vapor deposition mask 1 to come into contact with the target substrate 5 by magnetically attracting the magnetic material section 4; and a vapor deposition source 7 which emits vapor deposition particles 9 toward the vapor deposition mask 1.

As such, the above configuration makes it possible to provide a vapor deposition device 10 which makes it possible to (i) inhibit a reduction in the efficiency of utilization of vapor deposition particles 9, (ii) increase the degree of contact between the vapor deposition mask 1 and the target substrate 5, and (iii) increase the precision of the vapor deposition pattern.

A vapor deposition method in accordance with Aspect 10 of the present invention is a vapor deposition method for forming a vapor-deposited film 11, in a matrix, on a target substrate 5 by use of the vapor deposition device 10 in accordance with Aspect 9, the vapor deposition method including the steps of: (a) causing the target substrate 5 and the vapor deposition mask 1 to face each other and, thereafter, causing the vapor deposition mask 1 to come into contact with the target substrate 5 by using the magnetic force generating source 6 to magnetically attract the magnetic material section 4; and (b) forming the vapor-deposited film 11 on the target substrate 5, while the vapor deposition mask 1 and the target substrate 5 have been brought into contact with each other via magnetic force, by depositing vapor deposition particles 9 onto the target substrate 5 while concurrently causing at least one of the group consisting of (i) the target substrate 5, being in contact with the vapor deposition mask 1, and (ii) the vapor deposition source 7 to move in the first direction.

In the above method the target substrate 5 and the vapor deposition mask 1 are caused to face each other, and, thereafter, the magnetic material section 4 is magnetically attracted by use of a magnetic force generating source 6 provided opposite from the target substrate 5 with respect to the vapor deposition mask 1. This makes it possible to (i) prevent the vapor deposition mask 1 from separating from an area around each of the apertures 3 and (ii) reliably achieve close contact between the target substrate 5 and the vapor deposition mask 1.

As such, the above method makes it possible to carry out vapor deposition while the target substrate 5 and the vapor deposition mask 1 are in close contact with each other, particularly while portions of the vapor deposition mask 1 around each of the apertures 3 are in close contact with the target substrate 5, as described above. The above method therefore makes it possible to increase the precision of the vapor deposition pattern.

Furthermore, in the vapor deposition mask 1, a portion of the magnetic material section 4, which portion is between mutually adjacent ones of the second aperture lines, has a first thickness and a second thickness which is less than the first thickness, the first thickness being that of each sub-portion thereof where there is no intersection one of the first aperture lines, the second thickness being that of each sub-portion thereof where there is an intersection with one of the first aperture lines. This makes it possible for vapor deposition particles 9 travelling with respect to the first direction to enter the apertures 3 from a greater angle than vapor deposition particles 9 travelling diagonally.

As such, by carrying out deposition of the vapor deposition particles 9 onto the target substrate 5 while causing the vapor deposition source 7 to movie in the first direction, it is possible cause the vapor deposition particles 9 to enter the apertures 3 as the vapor deposition source 7 moves over a wide range, thereby increasing the efficiency of utilization of the vapor deposition particles 9. As a result, it becomes possible to increase mass production efficiency.

In Aspect 11 of the present invention, the method in accordance with Aspect 10 can be arranged such that the vapor-deposited film 11 is a luminescent layer of an electroluminescent display device.

The above vapor deposition method can be suitably used in the production of (i) an electroluminescent element and (ii) an electroluminescent display device including such an electroluminescent element.

A method of producing a vapor deposition mask 1 in accordance with Aspect 12 of the present invention includes the steps of: (a) preparing a laminated body in which a magnetic material film 40 is laminated onto a first main surface 2a of a mask substrate 2; (b) forming a magnetic material section 4 by etching the magnetic material film 40 such that the magnetic material section 4 includes main line sections 41, each of which is in the form of a stripe extending in a first direction, branch sections 42 which extend, in parallel with a second direction orthogonal to the first direction, from each side of each of the main line sections 41, and island sections 43, each of which is provided so as to be (i) between ones of the branch sections 42 which ones extend toward each other and (ii) separate from the main line sections 41 and the branch sections 42, each of the island sections 43 having a thickness which is less than that of (i) each of the branch sections 42 and (ii) each portion of each of the main line sections 41 which portion is positioned on a line passing through (i) one of the island sections 43 and (ii) one of the branch sections 42 adjacent to the one of the island sections 43; and (c) forming apertures 3 such that each of the apertures 3 is in a respective region surrounded by respective ones of the main line sections 41, the branch sections 42, and the island sections 43.

The above method makes it possible to produce a vapor deposition mask 1 including a magnetic material section 4 which is interposed between each of the apertures 3, in which a portion of the magnetic material section 4, which portion is between mutually adjacent ones of second aperture lines (X aperture lines 32) constituted by ones of a plurality of apertures 3 which ones are lined up in the second direction, has a first thickness and a second thickness less than the first thickness, the first thickness being that of each sub-portion thereof where there is no intersection with one of first aperture lines (Y aperture lines 31) constituted by ones of the plurality of apertures 3 which ones are lined up in the first direction (Y direction), the second thickness being that of each sub-portion thereof where there is an intersection with one of first aperture lines.

As such, the above method makes it possible to provide a method of producing a vapor deposition mask 1 which makes it possible to (i) inhibit a reduction in the efficiency of utilization of vapor deposition particles 9 travelling with respect to the first direction, (ii) increase the degree of contact between the vapor deposition mask and the target substrate 5, and (iii) increase the precision of the vapor deposition pattern.

In Aspect 13 of the present invention, the method in accordance with Aspect 12 can be arranged such that the step (b) includes the sub-steps of: (d) laminating a resist 80 onto the magnetic material film 40 and subsequently patterning the resist 80, via photolithography, such that the resist 80 includes a pattern of main lines (main line resist sections 81), each in the form of a stripe extending in the first direction, a pattern of branches (branch resist sections 82) which extend, in parallel with the second direction, from each side of each of the main lines, the branches each having a width along the first direction which width is less than that of a width, along the second direction, of each of the main lines, and a pattern of islands (island resist sections 83), each of which is provided (i) between ones of the branches which ones extend toward each other and (ii) so as to be separate from the main lines and the branches; and (e) performing wet etching of the magnetic material film 40 while using, as a mask, the resist 80 having been patterned.

Etching of the magnetic material film 40 progresses from a resist 80 side. Furthermore, each of the branches of the resist 80 has a width in the first direction which is less than a width, in the second direction, of each of the main lines of the resist 80. As such, in portions of the magnetic material film 40 beneath the branches of the resist 80, etching progresses from both ends, in the first direction, of the branches. As a result, each of the branch sections 42, which are each made from a respective portion of the magnetic material film 40 under a respective one of the branches of the resist 80, has a thickness which is less than that of each one of the main line sections 41, which are each made from a respective portion of the magnetic material film 40 under a respective one of the main lines of the resist 80.

It is therefore possible, with the above method, to achieve a vapor deposition mask 1 in which each of the branch sections 42, being positioned between mutually adjacent ones of the second aperture lines (X aperture lines 32), has a thickness which is less than that of each of the main line sections 41.

As such, the above method makes it possible to obtain a vapor deposition mask 1 which makes it possible to (i) increase an angle from which vapor deposition particles 9, travelling with respect to the first direction, can enter the aperture 3 and (ii) allow the vapor deposition particles 9 to pass through the apertures 3 from a very wide range of angles. This makes it possible to (i) effectively inhibit the occurrence of shadowing, and (ii) increase the efficiency of utilization of the vapor deposition particles 9.

In Aspect 14 of the present invention, the method in accordance with Aspect 12 or 13 can be arranged such that the step (b) includes the sub-step of: (f) forming a recessed portion 47 in each region, of each of the main line sections 41, which region is opposite a region in which one of the apertures 3 is formed.

The above method makes it possible to produce a vapor deposition mask 1 including a magnetic material section 4, in which a portion of the magnetic material section 4, which portion is between mutually adjacent ones of the first aperture lines (Y aperture lines 31) has a first thickness and a second thickness which is less than the first thickness, the first thickness being that of each sub-portion thereof where there is no intersection with one of the second aperture lines (X aperture lines 32), the second thickness being that of each sub-portion thereof where there is an intersection with one of the second aperture lines.

As such, with the above method, it is possible to obtain a vapor deposition mask 1 which makes it possible to (i) allow vapor deposition particles 9 to enter the aperture 3 from a greater angle than vapor deposition particles 9 travelling diagonally, (ii) inhibit a reduction in the efficiency of utilization of vapor deposition particles 9 travelling with respect to the second direction, and (iii) increase the degree of contact between the vapor deposition mask 1 and the target substrate 5.

A method of producing a vapor deposition mask 1 in accordance with Aspect 15 of the present invention includes the steps of: (a) preparing a laminated body which includes, in the following order, a mask substrate 2, a first magnetic material film (thin film 245) on a first main surface 2a of the mask substrate 2, and a second magnetic material film; (b)

etching the second magnetic material film such that the second magnetic material film has a matrix pattern in which non-continuous portions of the second magnetic material film are lined up in a first direction and in a second direction orthogonal to the first direction; and (c) forming apertures 3 in respective positions such that each portion (thick film sections 246) of the second magnetic material film, having been patterned, falls along a line passing diagonally through one of the apertures 3.

The above method makes it possible to produce a vapor deposition mask 1 including a magnetic material section 4 which is interposed between each of the plurality of apertures 3, in which a portion of the magnetic material section 4, which portion is between mutually adjacent ones of second aperture lines (X aperture lines 32) constituted by apertures 3 lined up in the second direction, has a first thickness and a second thickness which is less than the first thickness, the first thickness being that of each sub-portion thereof not intersecting with one of the first aperture lines (Y aperture lines 31) constituted by apertures 3 lined up in the first direction (Y direction), the second thickness being that of each sub-portion thereof intersecting with one of first aperture lines, the entirety of the vapor deposition mask 1 being magnetically attractable.

As such, the above method makes it possible to provide a method of producing a vapor deposition mask 1 which can (i) inhibit a reduction in the efficiency of utilization of vapor deposition particles 9 travelling with respect to the first direction, (ii) increase the degree of contact between the vapor deposition mask and the target substrate 5, and (iii) increase the precision of the vapor deposition pattern.

The present invention is not limited to the embodiments, but can be altered by a skilled person in the art within the scope of the claims. An embodiment derived from a proper combination of technical means each disclosed in a different embodiment is also encompassed in the technical scope of the present invention. Further, it is possible to form a new technical feature by combining the technical means disclosed in the respective embodiments.

An aspect of the present invention can be suitably utilized in producing, for example, an organic EL element, an inorganic EL element, an organic EL display device including the organic EL element, and an inorganic EL display device including the inorganic EL element.

REFERENCE SIGNS LIST

1 Vapor deposition mask
2 Mask substrate
3 Aperture
4 Magnetic body section
5 Target substrate
6 Magnetic force generating source
7 Vapor deposition source
8 Emission holes
9 Vapor deposition particles
10 Vapor deposition device
11 Vapor-deposited film
31 Y aperture line (first aperture line)
32 X aperture line (second aperture line)
41 Main line sections (magnetic material section)
42 Branch sections (magnetic material section)
43 Island sections (magnetic material section)
44 Magnetic body lines
45 Linear pattern section
46 Region
47 Recessed portions
47a Recessed portions bottom part
48 Protruding portions
80 Resist
81 Main line resist sections (pattern of main lines)
82 Branch resist sections (pattern of branches)
83 Island resist sections (pattern of islands)
245 Thin film (magnetic material section, first magnetic material film)
246 Thick film section (magnetic material section, second magnetic material film)
252, 262 Region
251 Portion between Y aperture lines
261 Portion between X aperture lines
271 Thick film section formation regions

The invention claimed is:

1. The vapor deposition mask for forming a vapor-deposited film, in a matrix, on a target substrate, the vapor deposition mask comprising:
a mask substrate; and
a magnetic material section provided on a first main surface of the mask substrate,
the mask substrate including a plurality of apertures constituting (i) first aperture lines, each constituted by ones of the plurality of apertures which ones are lined up in a first direction and (ii) second aperture lines, each constituted by ones of the plurality of apertures which ones are lined up in a second direction orthogonal to the first direction,
the magnetic material section being provided so as to be (iii) interposed between the first aperture lines and (iv) interposed between the second aperture lines,
a first portion of the magnetic material, which first portion is interposed between the second aperture lines, having a first thickness and a second thickness which is less than the first thickness,
the first thickness of the first portion being that of each sub-portion thereof which is positioned between mutually adjacent ones of the first aperture lines,
the second thickness of the first portion being that of each sub-portion thereof which is positioned between ones of the plurality of apertures which ones are mutually adjacent in the first direction;
wherein the magnetic material section includes:
main line sections, each of which is provided so as to be (i) positioned between the first aperture lines and (ii) in the form of a stripe extending in the first direction;
branch sections which extend, in parallel with the second direction, from each side of each of the main line sections; and
island sections, each of which is provided so as to be (i) between ones of the branch sections which ones extend toward each other, (ii) separate from the main line sections and the branch sections, and (iii) in a respective area, between mutually adjacent ones of the second aperture lines, where one of the first aperture lines intersects with the second aperture lines,
the island sections each having a thickness which is less than (i) that of each portion, of each of the main line sections, which portion is between mutually adjacent ones of second aperture lines and (ii) that of each of the branch sections between mutually adjacent ones of the second aperture lines; and
wherein each of the branch sections between mutually adjacent ones of second aperture lines has a thickness that is less than that of each of the main line sections.

2. The vapor deposition mask of claim 1, wherein a second portion of the magnetic material section, which second portion is interposed between the first aperture lines, has a first thickness and a second thickness which is less than the first thickness of the second portion, the first thickness of the second portion being that of each sub-portion thereof which is positioned between mutually adjacent ones of the second aperture lines, the second thickness of the second portion being that of each sub-portion thereof which is positioned between ones of the plurality of apertures which ones are mutually adjacent in the second direction.

3. The vapor deposition mask of claim 1, wherein:

the plurality of apertures are provided in a matrix; and each portion, of the magnetic material section, which is positioned between ones of the plurality of apertures which ones are mutually adjacent in the first direction or the second direction has a thickness which is less than that of each portion, of the magnetic material section, which is positioned between mutually diagonally adjacent ones of the plurality of apertures.

4. The vapor deposition mask of claim 1, wherein the magnetic material section includes:

a first magnetic material film laminated onto a portion of the mask substrate which portion excludes the plurality of apertures; and a second magnetic material film provided on a portion of the first magnetic material film which portion is positioned between mutually diagonally adjacent ones of the plurality of apertures.

5. The vapor deposition mask of claim 1, wherein the mask substrate is made from at least one material selected from a group consisting of resin and a ceramic material.

6. The vapor deposition mask of claim 5, wherein the resin includes at least one selected from a group consisting of polyimide, polyethylene, polyethylene naphthalate, polyethylene terephthalate, and epoxy resin.

7. A vapor deposition device comprising:

the vapor deposition mask as recited in claim 1;

a magnetic force generating source provided opposite from the vapor deposition mask with respect to the target substrate, the magnetic force generating source causing the vapor deposition mask to come into contact with the target substrate by magnetically attracting the magnetic material section; and a vapor deposition source which emits vapor deposition particles toward the vapor deposition mask.

8. A vapor deposition method for forming a vapor-deposited film, in a matrix, on a target substrate by use of the vapor deposition device as recited in claim 7, the vapor deposition method comprising the steps of:

(a) causing the target substrate and the vapor deposition mask to face each other and, thereafter, causing the vapor deposition mask to come into contact with the target substrate by using the magnetic force generating source to magnetically attract the magnetic material section; and (b) forming the vapor-deposited film on the target substrate, while the vapor deposition mask and the target substrate have been brought into contact with each other via magnetic force, by depositing vapor deposition particles onto the target substrate while concurrently causing at least one of the group consisting of (i) the target substrate, being in contact with the vapor deposition mask, and (ii) the vapor deposition source to move in the first direction.

9. The method of claim 8, wherein the vapor-deposited film is a luminescent layer of an electroluminescent display device.

10. The method of producing a vapor deposition mask, comprising the steps of:

(a) preparing a laminated body in which a magnetic material film is laminated onto a first main surface of a mask substrate;

(b) forming a magnetic material section by etching the magnetic material film such that the magnetic material section includes main line sections, each of which is in the form of a stripe extending in a first direction, branch sections which extend, in parallel with a second direction orthogonal to the first direction, from each side of each of the main line sections, and island sections, each of which is provided so as to be (i) between ones of the branch sections which ones extend toward each other and (ii) separate from the main line sections and the branch sections, each of the island sections having a thickness which is less than that of (i) each of the branch sections and (ii) each portion of each of the main line sections which portion is positioned on a line passing through (i) one of the island sections and (ii) one of the branch sections adjacent to the one of the island sections; and (c) forming apertures such that each of the apertures is in a respective region surrounded by respective ones of the main line sections, the branch sections, and the island sections; and wherein the step (b) includes the sub-steps of:

(d) laminating a resist onto the magnetic material film and subsequently patterning the resist, via photolithography, such that the resist includes a pattern of main lines, each in the form of a stripe extending in the first direction, a pattern of branches which extend, in parallel with the second direction, from each side of each of the main line sections, the branches each having a width along the first direction which width is less than that of a width, along the second direction, of each of the main lines, and a pattern of islands, each of which is provided (i) between ones of the branch sections which ones extend toward each other and (ii) so as to be separate from the main line sections and the branch sections; and (e) performing wet etching of the magnetic material film while using, as a mask, the resist having been patterned.

11. The method of claim 10, wherein the step (b) includes the sub-step of:

(f) forming a recessed portion in each region, of each of the main line sections, which region is opposite a region in which one of the apertures is formed.

* * * * *